(12) United States Patent
Caveney et al.

(10) Patent No.: US 9,656,386 B2
(45) Date of Patent: May 23, 2017

(54) COAXIAL DRIVE VACUUM ROBOT

(75) Inventors: Robert T. Caveney, Windham, NH (US); Ulysses Gilchrist, Reading, MA (US)

(73) Assignee: Brooks Automation, Inc., Chelmsford, MA (US)

( * ) Notice: Subject to any disclaimer, the term of this patent is extended or adjusted under 35 U.S.C. 154(b) by 1188 days.

(21) Appl. No.: 13/270,844

(22) Filed: Oct. 11, 2011

(65) Prior Publication Data

US 2012/0128450 A1     May 24, 2012

Related U.S. Application Data

(60) Provisional application No. 61/490,864, filed on May 27, 2011, provisional application No. 61/391,380, filed on Oct. 8, 2010.

(51) Int. Cl.
  *B25J 9/04* (2006.01)
  *H01L 21/677* (2006.01)

(52) U.S. Cl.
  CPC ........ *B25J 9/042* (2013.01); *H01L 21/67742* (2013.01)

(58) Field of Classification Search
  CPC ...... B25J 9/042; B25J 9/043; H01L 21/67742
  USPC ............................. 414/222.01, 226.05, 744.6
  See application file for complete search history.

(56) References Cited

U.S. PATENT DOCUMENTS

| | | |
|---|---|---|
| 4,666,366 A | 5/1987 | Davis |
| 4,730,976 A | 3/1988 | Davis et al. |
| 4,909,701 A | 3/1990 | Hardegen et al. |
| 5,046,992 A | 9/1991 | Tamai et al. |
| 5,147,175 A * | 9/1992 | Tada .......................... 414/744.5 |
| 5,180,276 A | 1/1993 | Hendrickson |
| 5,229,615 A | 7/1993 | Brune et al. |
| 5,431,529 A | 7/1995 | Eastman et al. |

(Continued)

FOREIGN PATENT DOCUMENTS

| | | |
|---|---|---|
| CN | 1574271 | 2/2005 |
| CN | 19022031 | 1/2007 |

(Continued)

OTHER PUBLICATIONS

Principles of Harmonic Drive: Harmonic Drive System, http://www.hds.co.jp/HDS_hp_english/english/principle/index.html, page accessed Sep. 7, 2010.

(Continued)

*Primary Examiner* — Dean Kramer
(74) *Attorney, Agent, or Firm* — Perman & Green, LLP; Colin C. Durham

(57) ABSTRACT

A robotic transport apparatus including a drive system including at least one harmonic motor assembly, at least one drive shaft coupled to the at least one harmonic motor assembly, at least one robotic arm mounted to the at least one drive shaft, where the robotic arm is located inside a sealed environment, and at least one atmospheric isolation seal seated on an output surface of the drive system and forming an atmospheric barrier disposed so that the at least one drive shaft extends through the atmospheric barrier into the sealed environment and the at least one harmonic motor assembly is located outside the sealed environment, wherein the robotic transport apparatus is a high capacity payload transport apparatus.

20 Claims, 30 Drawing Sheets

(56) References Cited

U.S. PATENT DOCUMENTS

| | | | |
|---|---|---|---|
| 5,647,724 A | 7/1997 | Davis, Jr. et al. | |
| 5,676,472 A | 10/1997 | Solomon et al. | |
| 5,720,590 A | 2/1998 | Hofmeister | |
| 5,775,169 A | 7/1998 | Solomon et al. | |
| 5,794,487 A | 8/1998 | Solomon et al. | |
| 5,899,658 A * | 5/1999 | Hofmeister | 414/744.5 |
| 5,950,495 A * | 9/1999 | Ogawa et al. | 74/490.01 |
| 6,062,099 A | 5/2000 | Suwa et al. | |
| 6,102,649 A * | 8/2000 | Ogawa et al. | 414/744.5 |
| 6,155,131 A | 12/2000 | Suwa et al. | |
| 6,265,803 B1 | 7/2001 | Caveney | |
| 6,428,266 B1 | 8/2002 | Solomon et al. | |
| 6,634,851 B1 | 10/2003 | Bonora et al. | |
| 6,779,962 B2 | 8/2004 | Poole | |
| 7,665,950 B2 | 2/2010 | Uratani et al. | |
| 7,736,118 B2 * | 6/2010 | Uratani et al. | 414/744.6 |
| 7,950,890 B2 | 5/2011 | Nakamura et al. | |
| 8,376,685 B2 | 2/2013 | Pietrantonio et al. | |
| 8,528,438 B2 * | 9/2013 | Chen et al. | 74/490.01 |
| 2009/0067958 A1 | 3/2009 | van der Meulen | |

FOREIGN PATENT DOCUMENTS

| | | |
|---|---|---|
| CN | 200970769 | 11/2007 |
| CN | 101112760 | 1/2008 |
| JP | 3-227036 | 10/1991 |
| JP | 6109866 | 4/1993 |
| JP | H09267280 | 10/1997 |
| JP | 10-270528 | 10/1998 |
| JP | 2000190258 | 7/2000 |
| JP | 2004146714 | 5/2004 |
| JP | 2005521268 | 7/2005 |
| JP | 2007216364 | 8/2007 |
| JP | 2007325433 | 12/2007 |
| JP | 20085022498 | 1/2008 |
| JP | 2008135630 | 6/2008 |
| JP | 2008272847 | 11/2008 |
| TW | 3181221 | 5/2010 |

OTHER PUBLICATIONS

CSD Series Component type, http://www.hds.co.jp/HDS_hp_english/english/products/hd/csd_c/index.html, page accessed Sep. 7, 2010.

* cited by examiner

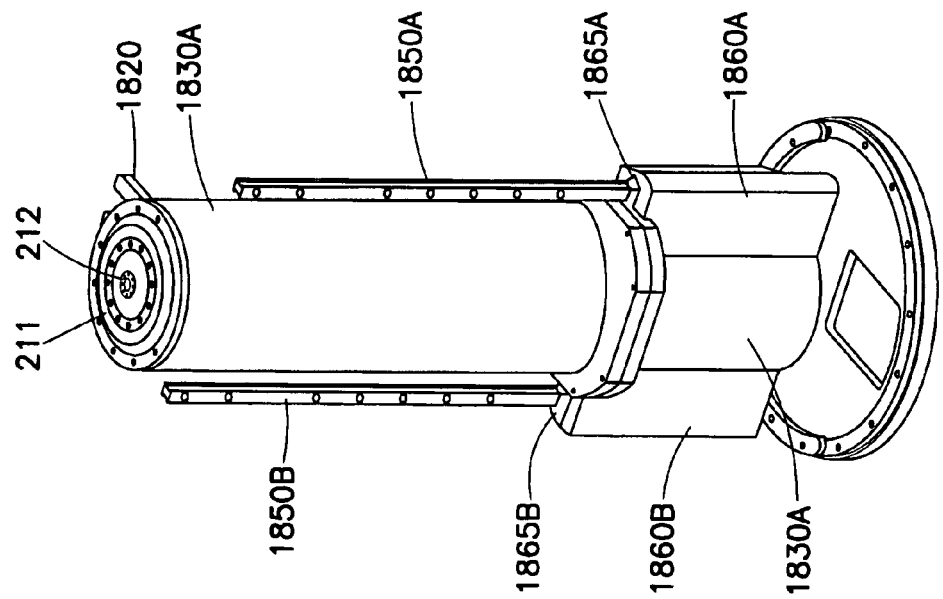
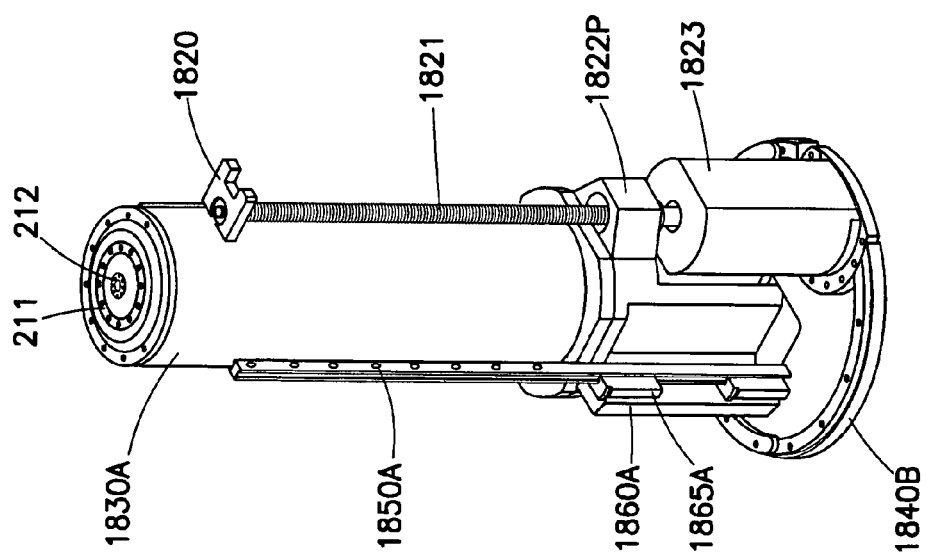

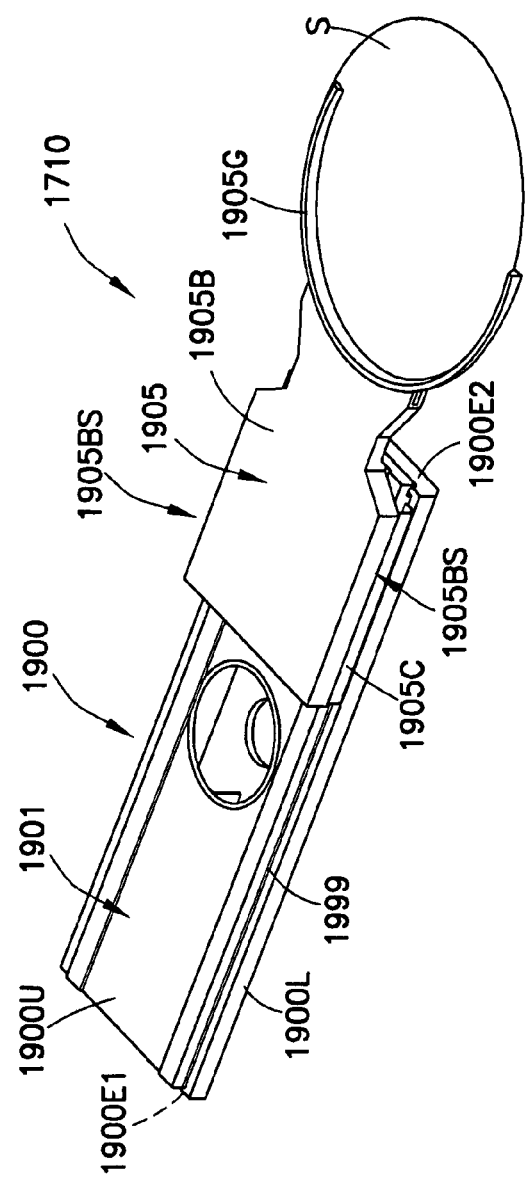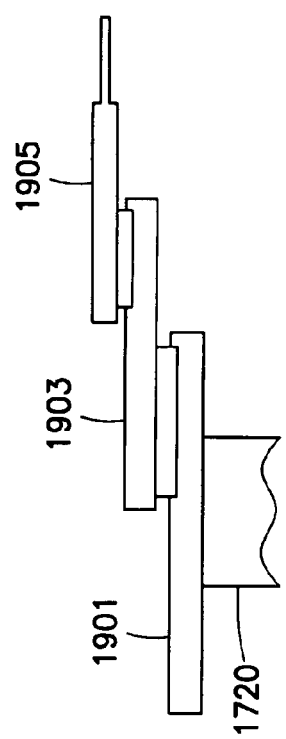

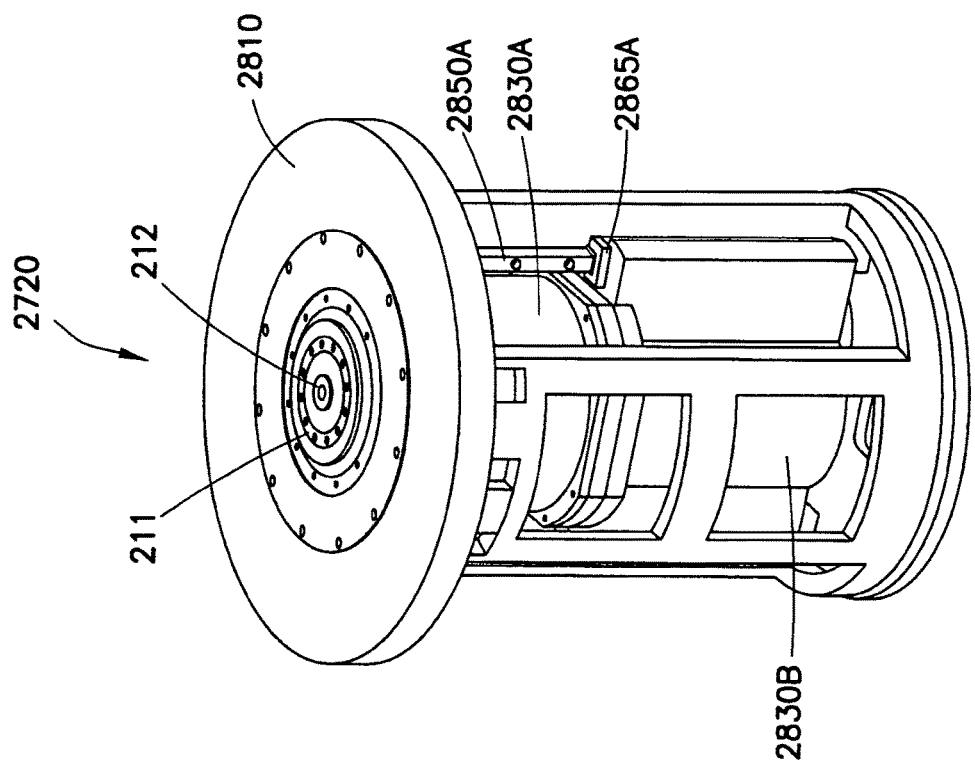
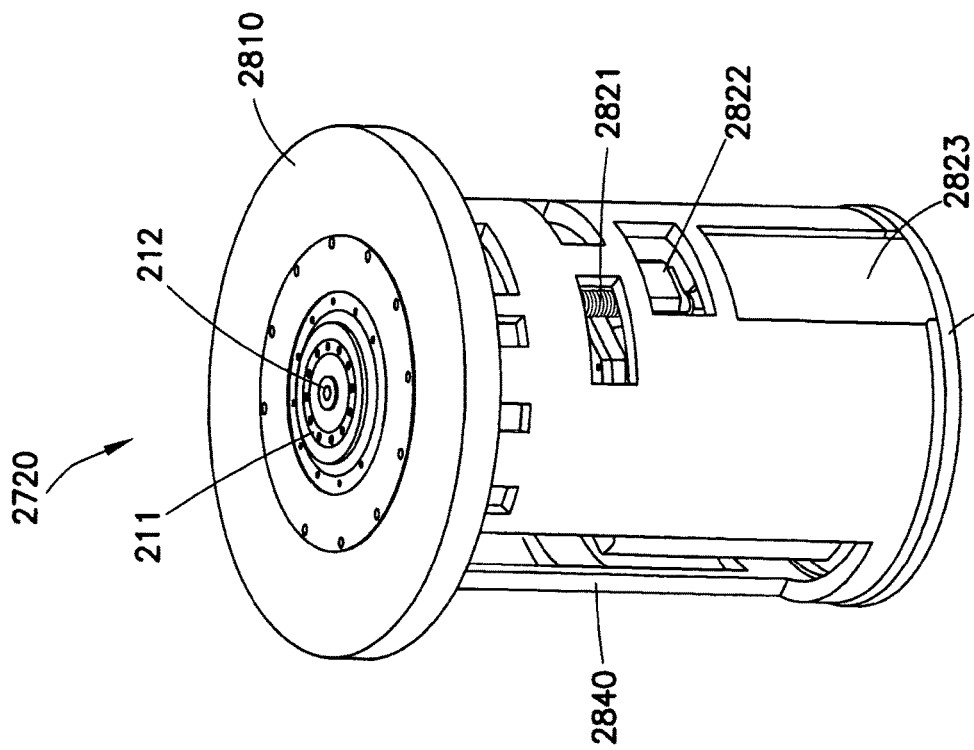

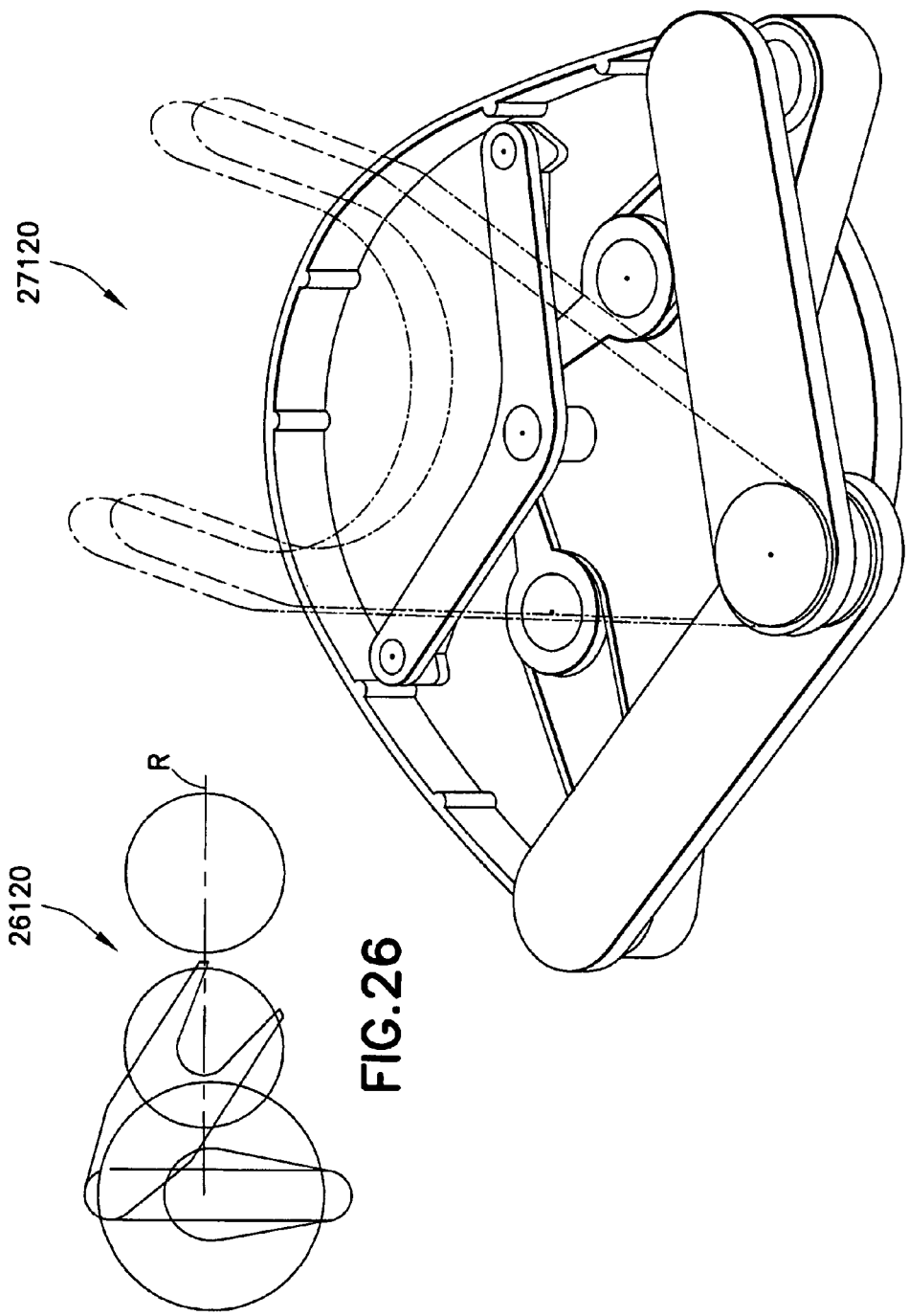

COAXIAL DRIVE VACUUM ROBOT

CROSS-REFERENCE TO RELATED APPLICATIONS

This application claims the benefit of U.S. provisional patent application Ser. Nos. 61/391,380 filed on Oct. 8, 2010 and 61/490,864 filed on May 27, 2011 the disclosures of which are incorporated by reference herein in their entireties.

BACKGROUND

1. Field

The exemplary embodiments generally relate to drives for robotic systems and, more particularly, to sealed and unsealed drives for robotic systems.

2. Brief Description of Related Developments

The use of ferrofluidic seals on conventional robotic actuators for carrying high capacity payloads generally requires that the ferrofluidic seal have integrated bearing modules to maintain the appropriate gap between the seal surfaces. The maintaining of the gap between the seal surfaces generally requires the drive motor to be mechanically coupled to the seal modules. Suitable bearings are also generally provided apart from the seal modules to stabilize the output shaft of the motor for maintaining the appropriate gap between the seal surfaces.

In addition, generally robotic actuators for carrying high payloads are driven by conventional drive motors coupled to the robotic arm using a gear reduction mechanism for driving the arm.

It would be advantageous to have a high capacity payload robotic actuator that leverages the output bearing of the motor actuator as the support bearing for the seal. This also applies to unsealed robot actuators (e.g. robot actuation without seals isolating different atmospheres) which benefit similarly. It would also be advantageous to have a direct drive high capacity robotic actuator.

BRIEF DESCRIPTION OF THE DRAWINGS

The foregoing aspects and other features of the disclosed embodiments are explained in the following description, taken in connection with the accompanying drawings, wherein:

FIGS. 8A-8C are schematic illustrations of a drive system in accordance with an aspect of the disclosed embodiment;

FIGS. 9A and 9B are schematic illustrations of a portion of the substrate transport apparatus of FIGS. 7A and 7B;

FIG. 9C is a schematic illustration of a portion of a substrate transport apparatus in accordance with an aspect of the disclosed embodiment;

FIGS. 12A-12C are schematic illustrations of a drive system in accordance with an aspect of the disclosed embodiment;

FIG. 26 illustrates an unequal length SCARA arm in accordance with an aspect of the disclosed embodiment;

FIG. 27 illustrates SCARA transport arm, in accordance with an aspect of the disclosed embodiment, having a mechanical switch incorporating a lost motion mechanism that allows one end effector to extend while the other end effector remains substantially in a retracted configuration;

DETAILED DESCRIPTION

Figure 1:
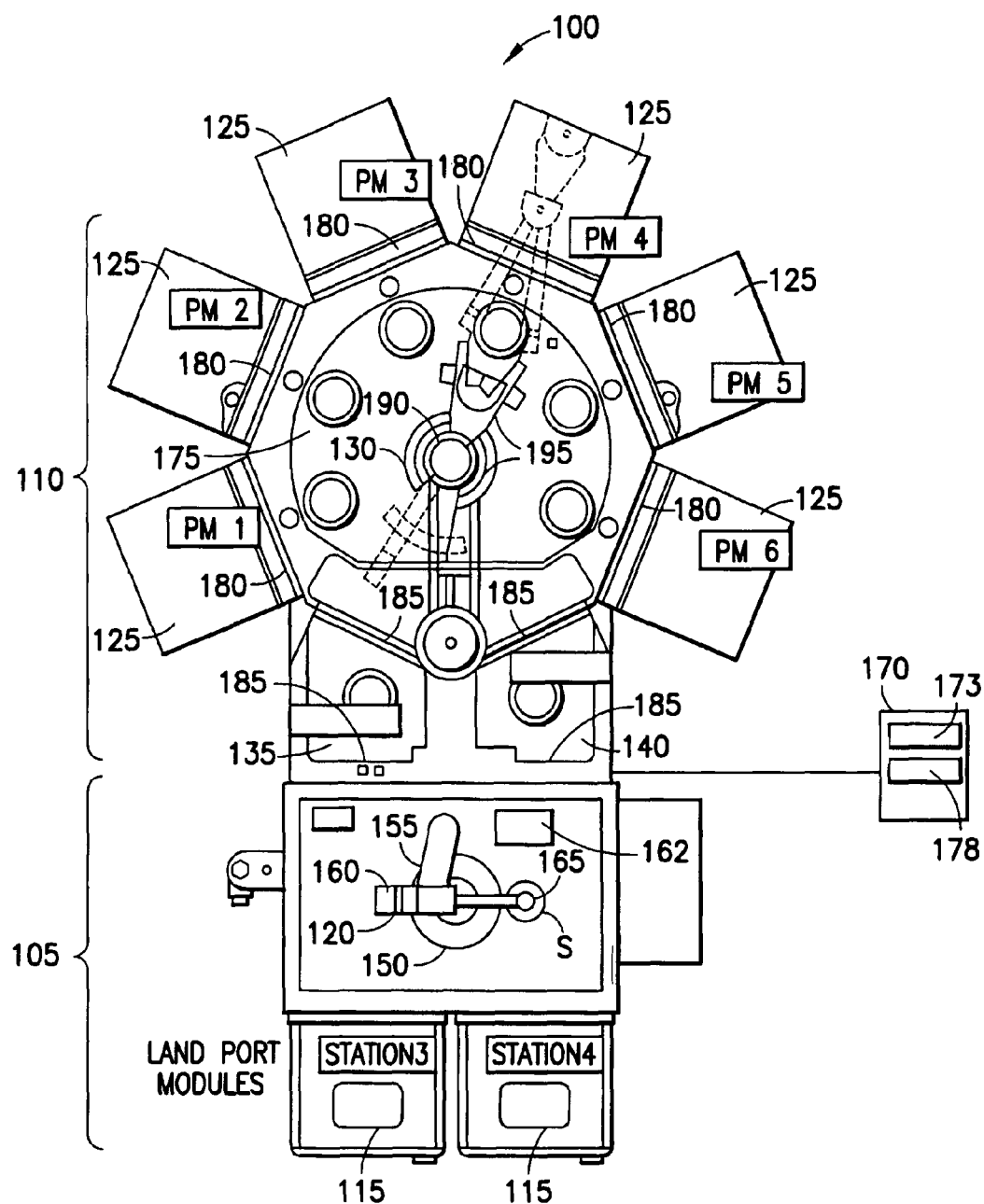
FIG. 1 is a schematic illustration of a portion of a substrate processing apparatus incorporating features in accordance with an aspect of the disclosed embodiment.

FIG. 1 is a schematic illustration of a substrate processing apparatus incorporating features in accordance with an aspect of the disclosed embodiment. Although the aspects of the disclosed embodiment will be described with reference to the drawings, it should be understood that the aspects of the disclosed embodiment can be embodied in many alternate forms. In addition, any suitable size, shape or type of elements or materials could be used.

Figure 2:
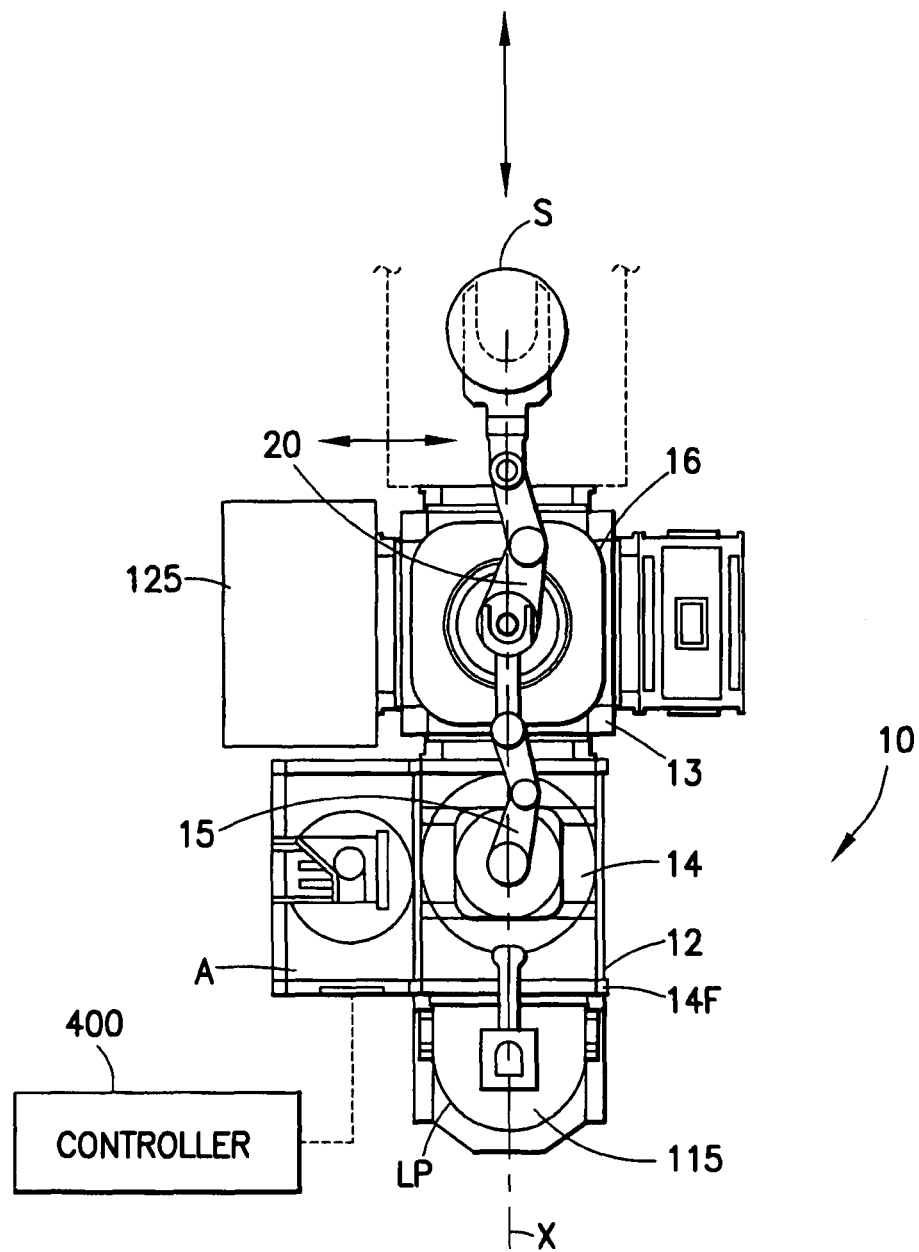
FIG. 2 is a schematic view of a portion of a substrate processing apparatus incorporating features in accordance with an aspect of the disclosed embodiment.
Figure 3:
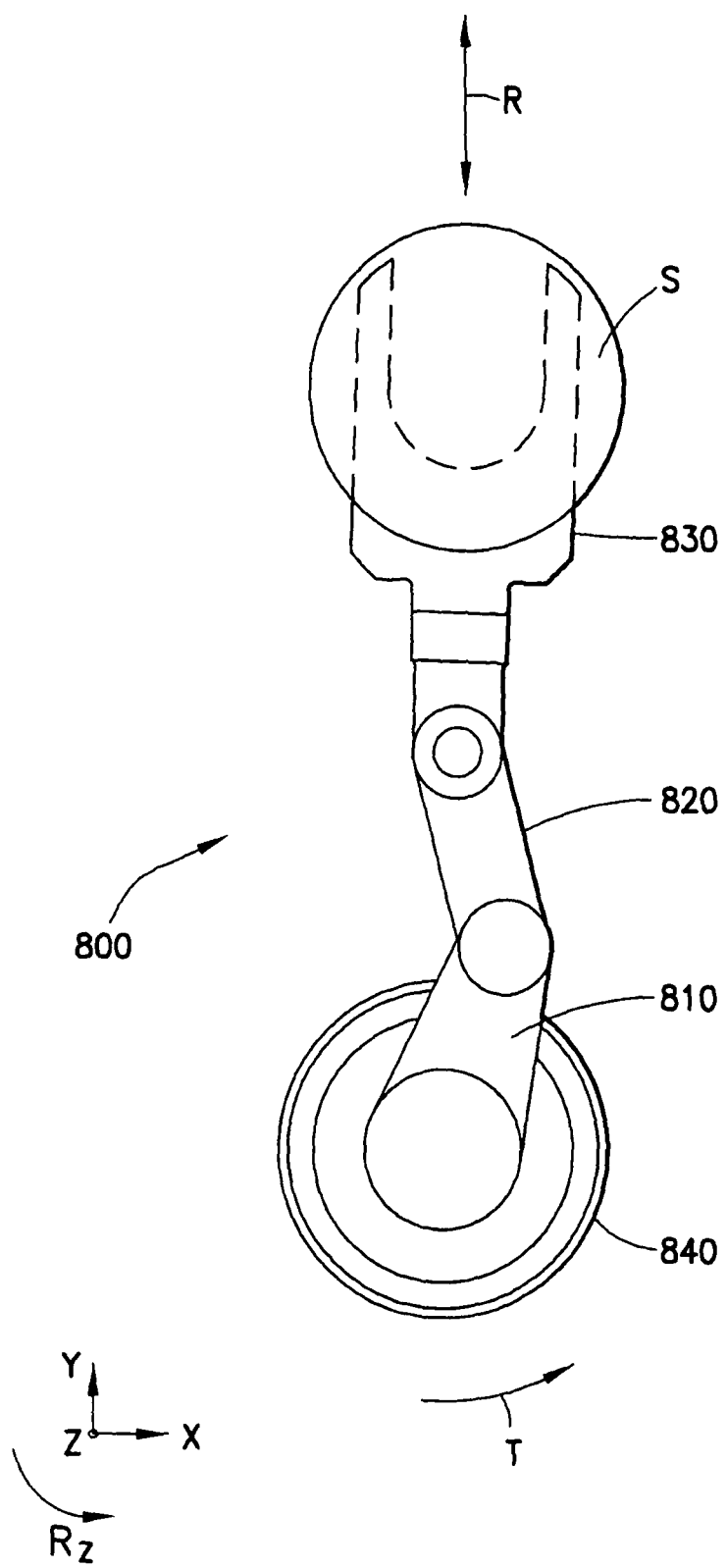
FIG. 3 is a schematic illustration of a substrate transport apparatus in accordance with an aspect of the disclosed embodiment.

The substrate processing apparatus 100 shown in Figure is a representative substrate processing tool incorporating features of in accordance with aspects of the disclosed embodiment. In this example the processing apparatus 100 is shown as having a general batch processing tool configuration. In other aspects the tool may have any desired arrangement, for example the tool may be configured to perform single step processing of substrates or have a linear or Cartesian arrangement such as shown in FIGS. 2 and 3. In still other aspects, the substrate processing apparatus may be of any desired type such as sorter, stocker, metrology tool, etc. The substrates S processed in the apparatus 100 may be any suitable substrates including, but not limited to, liquid crystal display panels, solar panels, semiconductor wafers, such as a 200 mm, 300 mm, 450 mm diameter wafers, or any other desired diameter substrate, any other type of substrate having any suitable shape, size and thickness suitable for processing by substrate processing apparatus 100, such as a blank substrate, or an article having characteristics similar to a substrate, such as certain dimensions or a particular mass.

In one aspect, the apparatus 100 may generally have a front section 105, for example forming a mini-environment and an adjoining atmospherically isolatable or sealed section 110 that can be sealed from an external environment for holding a controlled sealed atmosphere, which for example may be equipped to function as a vacuum chamber. In other aspects, the sealed atmosphere section may hold an inert gas (e.g. $N_2$) or any other environmentally sealed and/or controlled atmosphere.

The front section 105 may generally have, for example one or more substrate holding cassettes 115, and a front end robot 120. The front section 105 may also, for example, have other stations or sections such as an aligner 162 or buffer located therein. Section 110 may have one or more processing modules 125, and a vacuum robot arm 130. The processing modules 125 may be of any type such as material deposition, etching, baking, polishing, ion implantation cleaning, etc. As may be realized the position of each module, with respect to a desired reference frame, such as the robot reference frame, may be registered with controller 170. Also, one or more of the modules may process the substrate(s) S with the substrate in a desired orientation, established for example using a fiducial (not shown) on the substrate. Desired orientation for substrate(s) in processing modules may also be registered in the controller 170. Sealed section 110 may also have one or more intermediate chambers, referred to as load locks. The apparatus 100 shown in FIG. 1 has two load locks, load lock 135 and load lock 140. Load locks 135, 140 operate as interfaces, allowing substrates S to pass between front section 105 and sealed section 110 without violating the integrity of any environmentally sealed atmosphere that may be present in sealed section 110. Substrate processing apparatus 100 generally includes a controller 170 that controls the operation of substrate processing apparatus 100. In one embodiment the controller may be part of a clustered control architecture as described in U.S. patent application Ser. No. 11/178,615, filed on Jul. 11, 2005, the disclosure of which is incorporated by reference herein in its entirety. The controller 170 has a processor 173 and a memory 178. In addition to the information noted above, memory 178 may include programs including techniques for on-the-fly substrate eccentricity and misalignment detection and correction. Memory 178 may further include processing parameters, such as temperature and/or pressure of processing modules, and other portions or stations of sections 105, 110 of the apparatus, temporal information of the substrate(s) S being processed and metric information for the substrates, and program, such as algorithms, for applying this ephemeris data of apparatus and substrates to determine on the fly substrate eccentricity.

The front end robot 120, also referred to as an ATM (atmospheric) robot, may include a drive section 150 and one or more arms 155. At least one arm 155 may be mounted onto drive section 150. At least one arm 155 may be coupled to a wrist 160, which in turn is coupled to one or more end effector(s) 165 for holding one or more substrate(s) S. End effector(s) 165 may be rotatably coupled to wrist 160. ATM robot 120 may be adapted to transport substrates to any location within front section 105. For example, ATM robot 120 may transport substrates among substrate holding cassettes 115, load lock 135, and load lock 140. ATM robot 120 may also transport substrates S to and from the aligner 162. Drive section 150 may receive commands from controller 170 and, in response, direct radial, circumferential, elevational, compound, and other motions of ATM robot 120.

Figure 22:
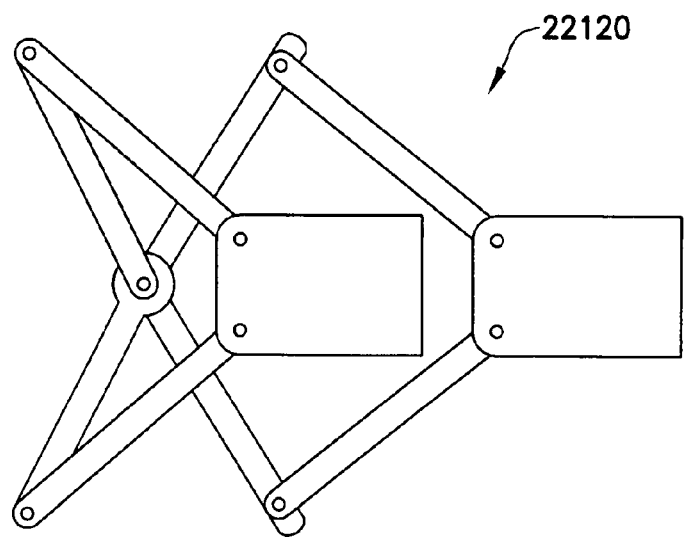
FIG. 22 illustrates an exemplary dual frog leg transport in accordance with an aspect of the disclosed embodiment.
Figure 23A:
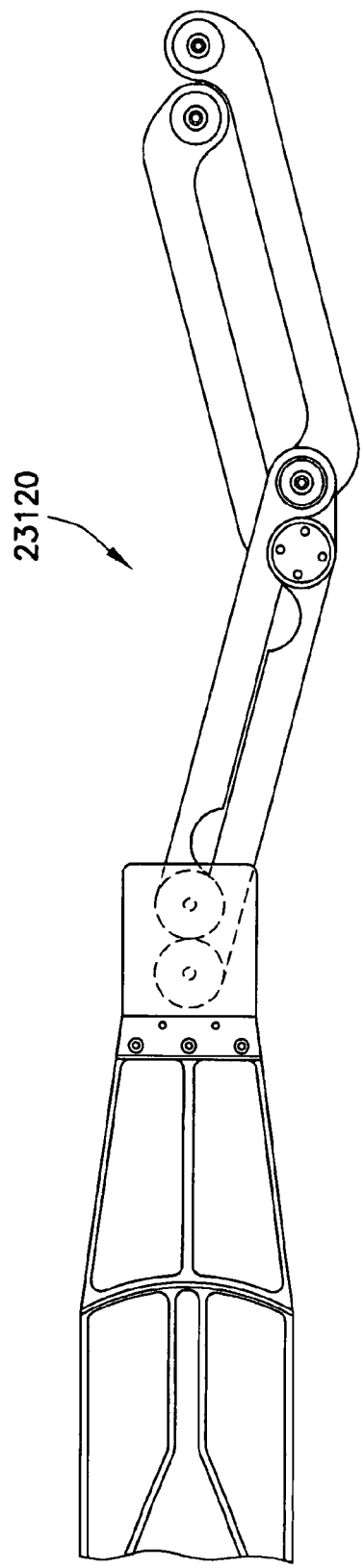
FIGS. 23A and 23B illustrates an exemplary articulated arm transport in accordance with an aspect of the disclosed embodiment.
Figure 23B:
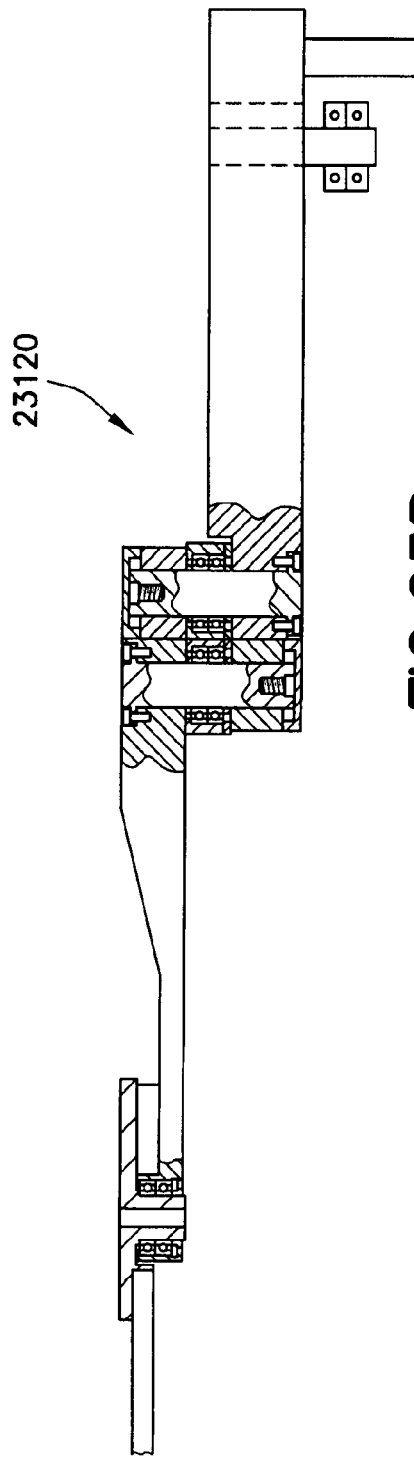
Figure 24A:
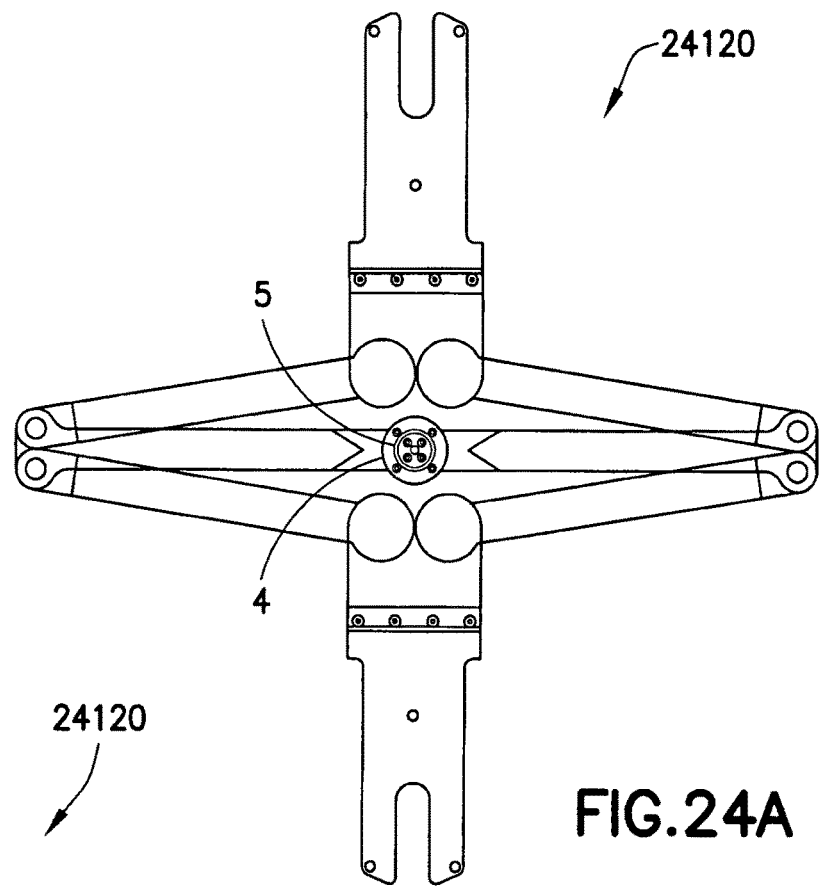
FIGS. 24A-24D illustrate exemplary bisymmetric transports in accordance with an aspect of the disclosed embodiment.
Figure 24B:
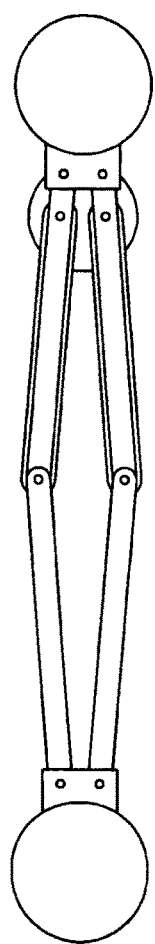
Figures 24C, 24D:
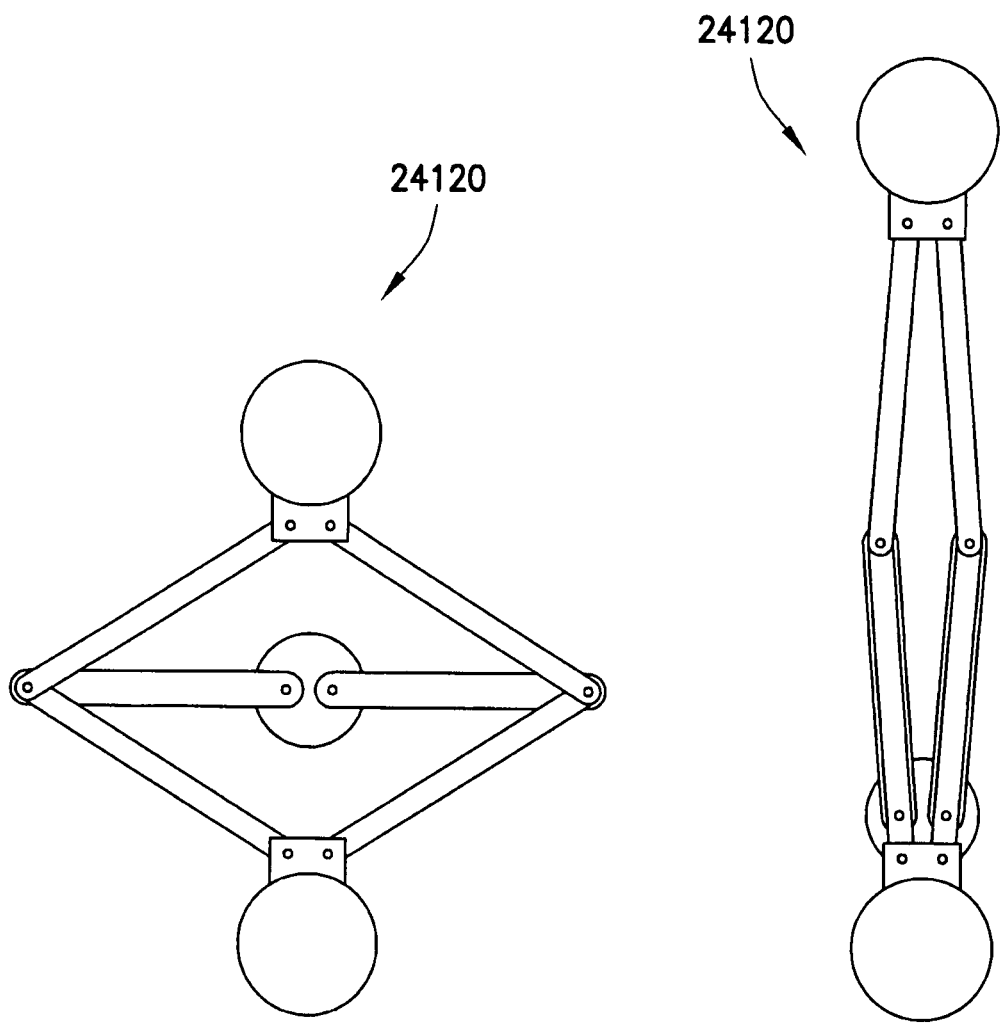
Figure 25:
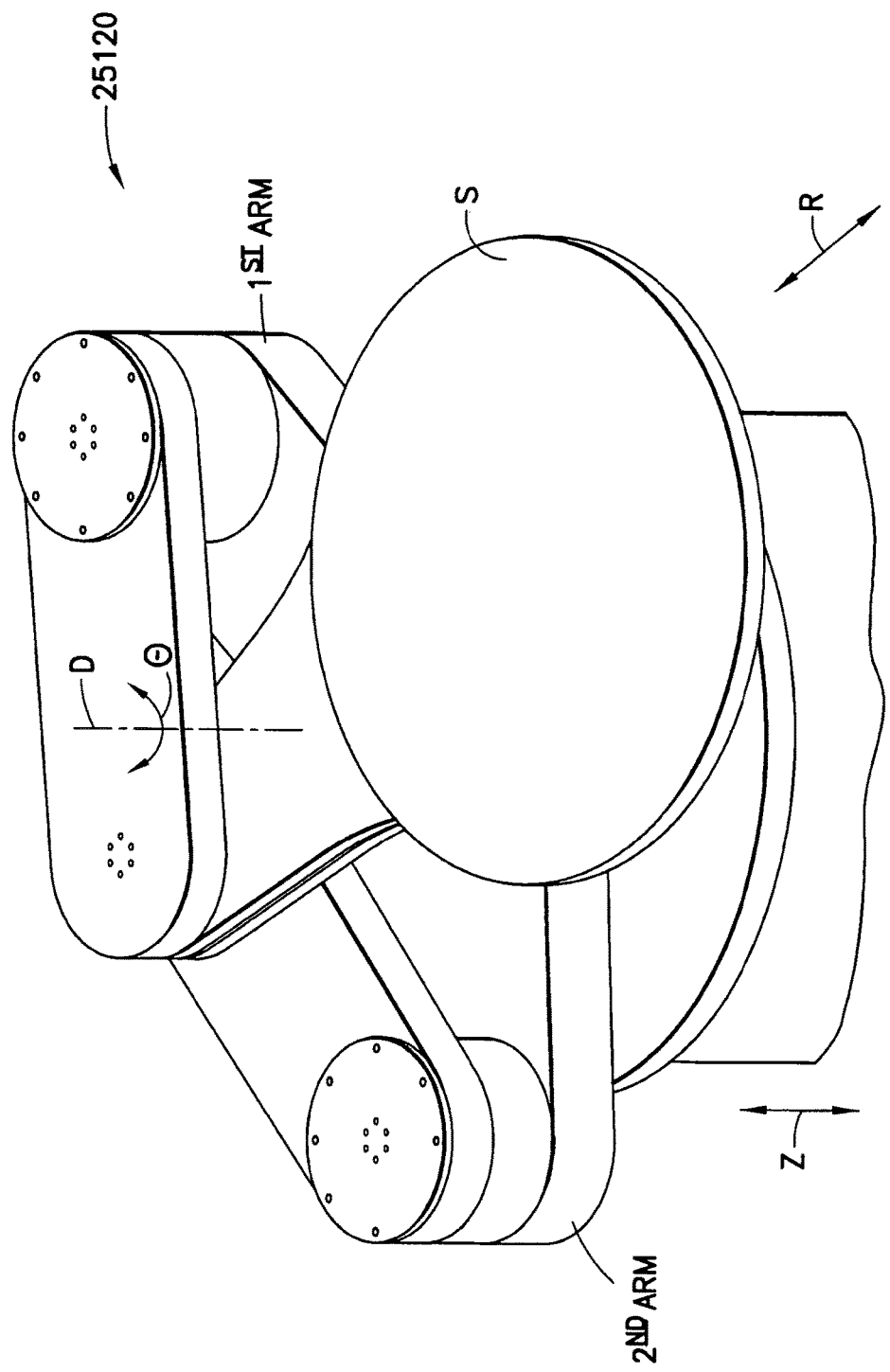
FIG. 25 illustrates a dual arm SCARA transport having a butterfly arm configuration in accordance with an aspect of the disclosed embodiment.
Figure 28:
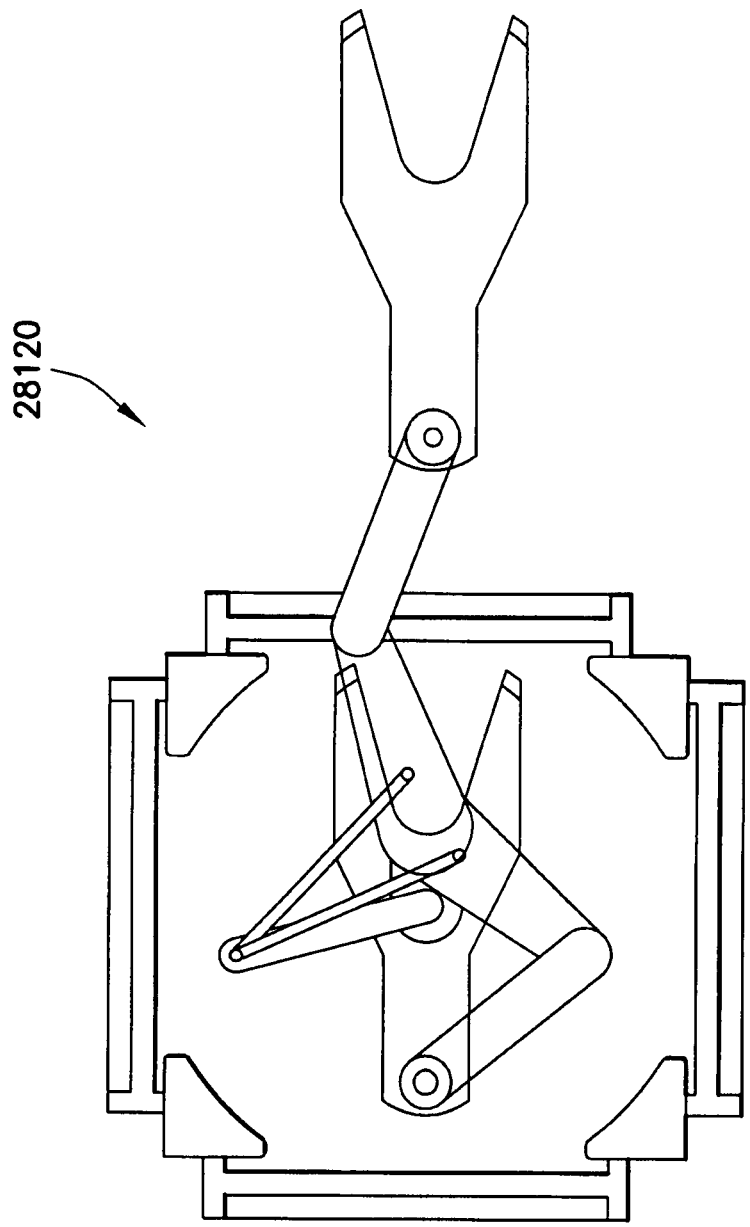
FIG. 28 illustrates a bifurcated SCARA arm in accordance with an aspect of the disclosed embodiment where the arms are coupled so as one arm extends the other arm retracts.
Figure 29:
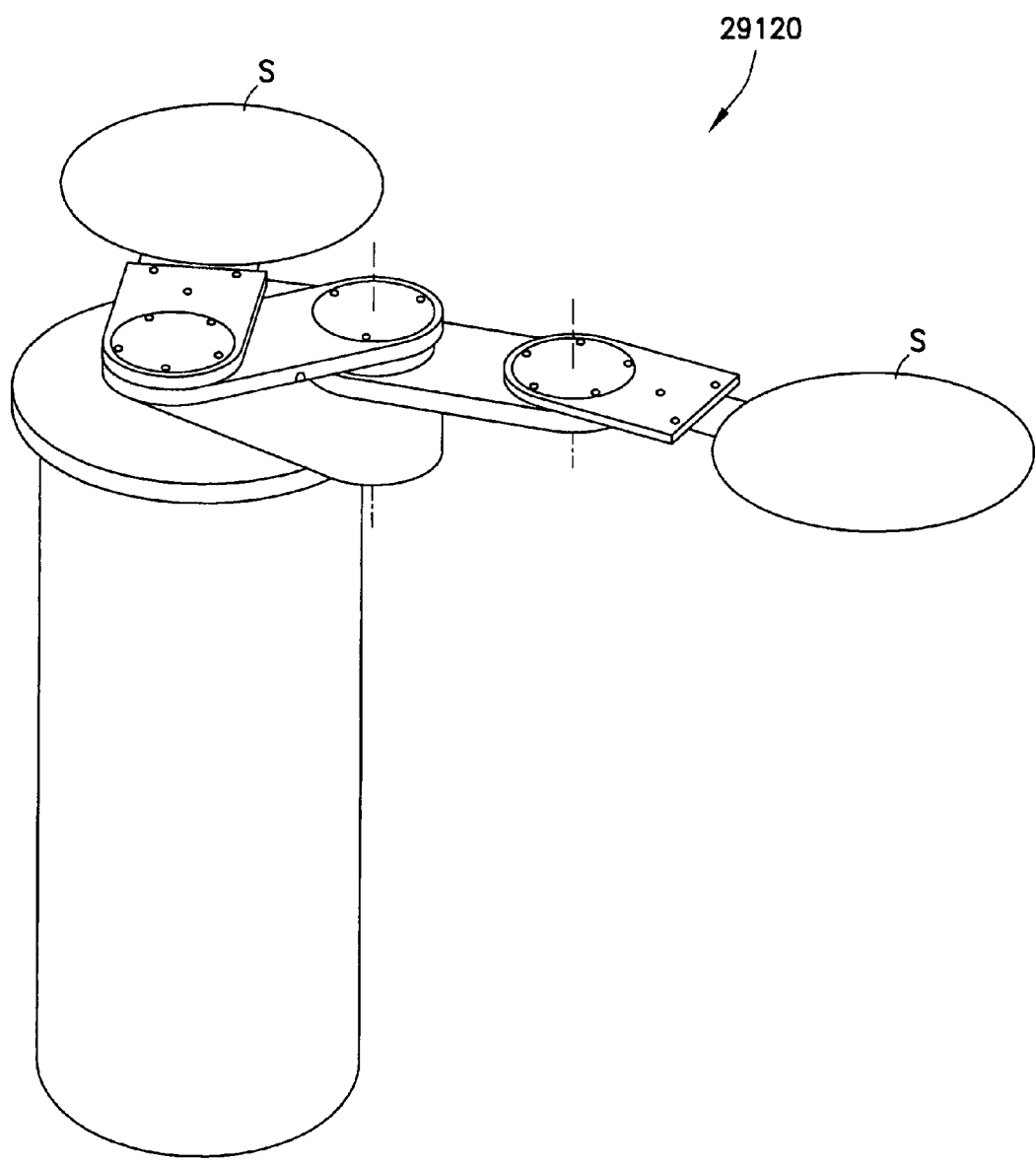
FIG. 29 illustrates a SCARA-type robot having a single upper arm with dual forearms and end effectors in accordance with an aspect of the disclosed embodiment.

The vacuum robot arm 130 may be mounted in central chamber 175 of section 110. Controller 170 may operate to cycle openings 180, 185 and coordinate the operation of vacuum robot arm 130 for transporting substrates among processing modules 125, load lock 135, and load lock 140. Vacuum robot arm 130 may include a drive section 190 (as will be described in greater detail below) and one or more end effectors 195. In other aspects, ATM robot 120 and vacuum robot arm 130 may be any suitable type of transport apparatus, including but not limited to, a sliding arm robot (see e.g. FIGS. 1, 7A-7B, 9A-11C, 13A, 13C-14B, 16-21), a SCARA-type robot having two degrees of freedom (when used with coaxial drives having e.g. two output shafts as described herein) and or three degrees of freedom (when used with tri-axial drives having three output shafts as described herein) (see e.g. FIGS. 1-3), a dual arm SCARA-type robot having a butterfly configuration (see e.g. FIG. 25, Ref. No. 25120), a SCARA-type robot having a single upper arm with dual forearms and end effectors (see e.g. FIG. 29, Ref. No. 29120), an unequal arm link SCARA-type robot (see e.g. FIG. 26, Ref. No. 26120), a bifurcated SCARA-type robot (see e.g. FIG. 28, Ref. No. 28120), an articulating arm robot (see e.g. FIG. 23A, 23B, Ref. No. 23120), a SCARA-type transport arm having a mechanical switch incorporating a lost motion mechanism (see e.g. FIG. 27, Ref. No. 27120), a frog leg type transport apparatus (see e.g. FIG. 1), a leap frog type transport (see e.g. FIG. 22, Ref. No. 22120), or a bi-symmetric transport apparatus (see e.g. FIGS. 24A-24D, Ref. No. 24120). As may be realized, in other aspects the above-described arms may be configured to batch transport substrates such that the arms include a stack of more than one end effector or more than one end effector located side by side.

Referring to FIG. 2, there is shown a schematic plan view of another substrate processing apparatus 10 incorporating features in accordance with an aspect of the disclosed embodiment. The substrate processing apparatus 10 is illustrated as having a linear or Cartesian arrangement in which substrates S are passed between transfer robots through an elongated transfer chamber. The workpiece processing system 10, or tool, generally has a processing section 13 and an interface section 12. The interface and processing sections of the tool 10 are connected to each other and allow transport of workpieces in between. The processing section 13 of the tool may have processing modules or chambers, substantially similar to those described above with respect to FIG. 1. The processing modules may be linked by a workpiece transport chamber 16 in which the workpieces may be transported between desired processing modules according to the processing protocol. The transport chamber has a transport robot 20 capable of moving the workpieces therein and to the processing modules 125. The processing modules 125 and the transport chamber are capable of being atmospherically isolated so they are able to hold a controlled atmosphere that is environmentally sealed from an exterior atmosphere in order to maintain atmosphere within the transport chamber the same as the processing modules, or suitable for workpieces being transferred between processing modules in a manner substantially similar to that described above with respect to FIG. 1. The tool interface section 12 provides a workpiece loading/unloading interface between the tool processing section 13 and its controlled sealed atmosphere and the tool exterior. An example of a suitable environmental interface section is disclosed in U.S. patent application Ser. No. 11/178,836, filed Jul. 11, 2005 incorporated by reference herein in its entirety. The tool interface section thus allows workpieces, that may be transported in carriers outside the tool, to be unloaded from the carrier into the tool and vice versa. The transport chamber may be made up of transport chamber modules, that may be connected end to end for example to form a linearly elongated transport chamber. The transport chamber length is thus variable by adding or removing transport chamber modules. The transport chamber modules may have entry/exit gate valves capable of isolating desired transport chamber module from adjoining portions of the transport chambers. Tool interface sections similar to section 12 may be positioned at any desired locations along the linearly elongated transport chamber allowing workpieces to be loaded or unloaded at a desired location in the tool. Processing modules may be distributed along the length of the transport chamber. The processing modules may be stacked in a direction angled to the length of the chamber. The transport chamber modules may have entry/exit gate valves to isolate desired transport chamber modules from the processing modules. The transport system 20 is distributed through the transport chamber. A number of the transport chamber modules may each have an integral movable arm having a fixed interface/mount to the module and movable end effector capable of holding and moving workpieces linearly along the transport chamber and between transport chamber and processing modules. Transport arms in different transport chamber modules may cooperate to form at least a portion of the linearly distributed transport system. Operation of the transport system, processing modules, processing section, interface section and any other portions of the tool may be controlled by controller 400 that may be substantially similar to controller 170 described above. The transport chamber and transport system therein may be arranged to define multiple workpiece travel lanes within the transport chamber. The travel lanes may be polarized or dedicated within the transport chamber for advance and return of workpieces. The transport chamber may also have intermediate load locks allowing different sections of the transport chamber to hold different atmospheres, and allow workpieces to transit between the different atmospheric sections of the transport chamber. The transport chamber may have an entry/exit station(s), where workpieces may be inserted/removed from a desired location of the transport chamber. For example, the entry/exit station may be located at an opposite end from the interface section 12 or other desired position in the transport chamber. The entry exit station(s) of the transport chamber may communicate with a workpiece express transit passage linking entry/exit station of the transport chamber with a remote tool interface section 12. The express transit passage may be independent of and isolatable from the transport chamber 16. The express transit passage may communicate with one or more of the interface section 12 so that workpieces may be transported between the interface section and transit passage. Workpieces, may be rapidly placed into an advanced section of the tool and returned to the interface section 12 after processing via the express transit passage, without affecting the transport chamber, and resulting in a reduction of work in process (WIP). The transport chamber may also have intermediate entry/exit stations, a number of which may communicate with the express transit passage so that workpieces may be transported therebetween. This allows workpieces to be inserted or removed at desired intermediate portions of the process without affecting the process stream as described in U.S. patent application Ser. No. 11/442,511 filed on May 26, 2006, the disclosure of which is incorporated herein by reference in its entirety.

The interface section 12 mates directly to the transport chamber (as shown in FIG. 1) without any intervening load locks. In other aspects a load lock may be placed between the interface section 12 and the transport chamber. The interface section shown in FIG. 1 has a workpiece transport 15 for moving workpieces from a cassette 115 mated to the load port LP, to the transport chamber 16. The transport 15 is located inside the interface section chamber 14, and may be substantially similar to the transport 150 described above. The interface section may also include workpiece station(s) A such as an aligner station, buffer station, metrology station and any other desired handling station for workpiece(s) S.

Although some aspects of the disclosed embodiment will be described herein with respect to a vacuum robot or transport, such as for example transport 800 of FIG. 3, it should be realized that the disclosed embodiment can be employed in any suitable transport or other processing equipment (e.g. aligners, etc.) operating in any suitable environment including, but not limited to, atmospheric environments, controlled atmosphere environments and/or vacuum environments. In one aspect, the transport 800 may have for example multiple independently movable end effectors for independently moving multiple workpieces. The transport 800 shown in FIG. 3 is illustrated for example as a multi-articulated link arm, that may have any suitable numbers of degrees of freedom in for example rotation, extension/retraction and/or lift (e.g. Z-axis motion). It should also be realized that the transports incorporating aspects of the exemplary embodiments can have any suitable configuration including, but not limited to, a sliding arm robot (see e.g. FIGS. 1, 7A-7B, 9A-11C, 13A, 13C-14B, 16-21), a SCARA-type robot having two degrees of freedom (when used with coaxial drives having e.g. two output shafts as described herein) and or three degrees of freedom (when used with tri-axial drives having three output shafts as described herein) (see e.g. FIGS. 1-3), a dual arm SCARA-type robot having a butterfly configuration (see e.g. FIG. 25, Ref. No. 25120), a SCARA-type robot having a single upper arm with dual forearms and end effectors (see e.g. FIG. 29, Ref. No. 29120), an unequal arm link SCARA-type robot (see e.g. FIG. 26, Ref. No. 26120), a bifurcated SCARA-type robot (see e.g. FIG. 28, Ref. No. 28120), an articulating arm robot (see e.g. FIG. 23A, 23B, Ref. No. 23120), a SCARA-type transport arm having a mechanical switch incorporating a lost motion mechanism (see e.g. FIG. 27, Ref. No. 27120), a frog leg type transport apparatus (see e.g. FIG. 1), a leap frog type transport (see e.g. FIG. 22, Ref. No. 22120), or a bi-symmetric transport apparatus (see e.g. FIGS. 24A-24D, Ref. No. 24120). Suitable examples of robot arms with which the drive system of the exemplary embodiments may be employed can be found in U.S. Pat. Nos. 4,666,366; 4,730,976; 4,909,701; 5,431,529; 5,577,879; 5,720,590; 5,899,658; 5,180,276; 5,647,724; 7,578,649 and U.S. application Ser. No. 11/148,871 entitled "DUAL SCARA ARM" and filed on Jun. 9, 2005; Ser. No. 12/117,415 entitled "SUBSTRATE HANDLING APPARATUS WITH MULTIPLE MOVABLE ARMS UTILIZING A MECHANICAL SWITCH MECHANISM" filed on May 8, 2008; Ser. No. 11/697,390 entitled "SUBSTRATE TRANSPORT APPARATUS WITH MULTIPLE INDEPENDENTLY MOVABLE ARTICULATED ARMS" filed on Apr. 6, 2007; and Ser. No. 11/179,762 entitled UNEQUAL LINK SCARA ARM" filed on Jul. 11, 2005, the disclosures of which are incorporated herein by reference in their entireties. As noted above, in other aspects the above-described arms may be configured to batch transport substrates such that the arms include a stack of more than one end effector or more than one end effector located side by side. It should be understood that the transports described in the aspects of the disclosed embodiment described herein are high capacity payload transports configured to transport heavy and/or large payloads such as for example, liquid crystal display panels and solar panels or other heavy payloads in excess of, for example, about one (1) kilogram to about twenty (20) kilograms and in particular payloads of about fifteen (15) kilograms to about twenty (20) kilograms and more particularly payloads of about fifteen (15) kilograms and payloads of about twenty (20) kilograms. In other aspects the payloads may be more than about twenty (20) kilograms or less than about one (1) kilogram.

Figure 4:
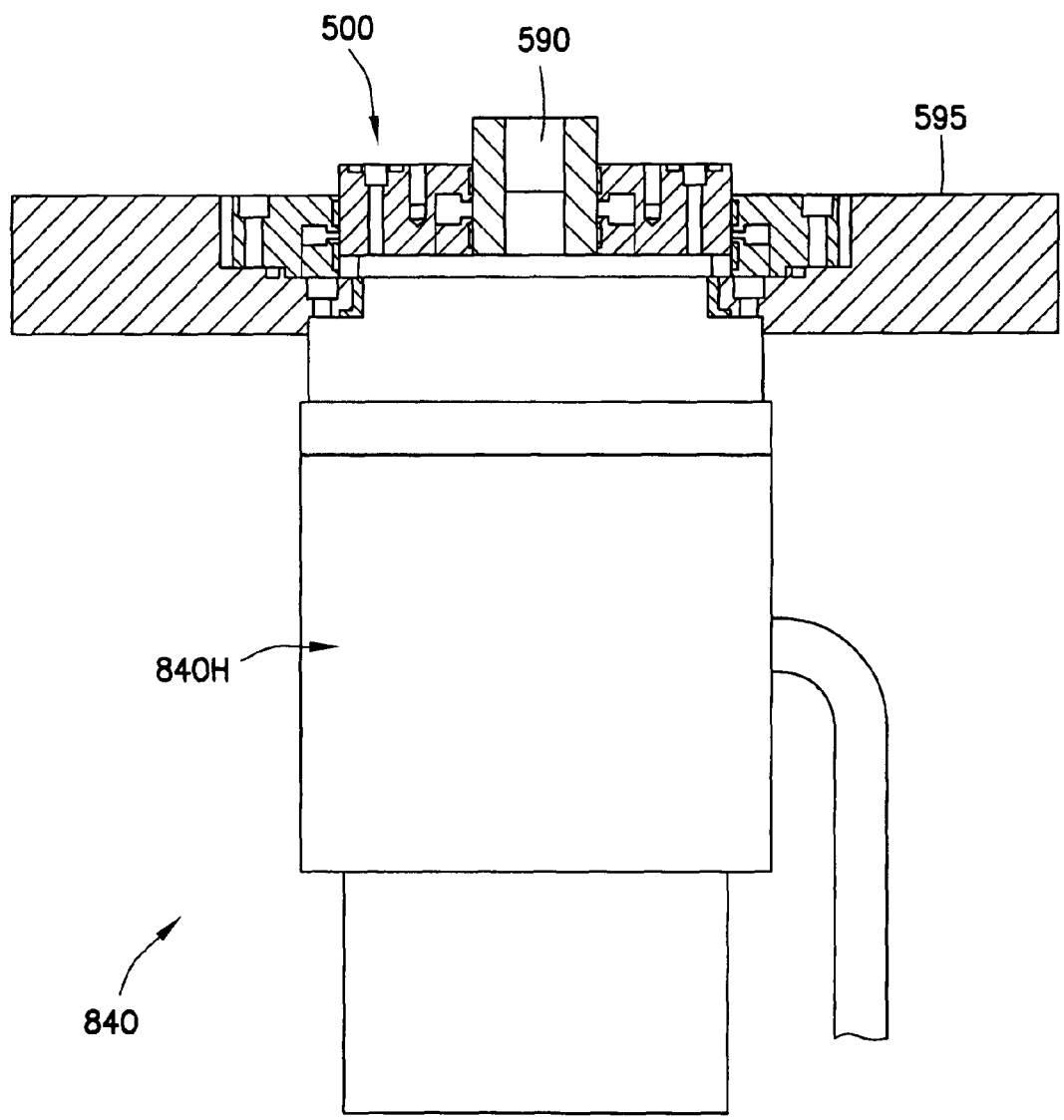
FIG. 4 is a schematic illustration of the drive system of FIG. 3 in accordance with an aspect of the disclosed embodiment.
Figure 5:
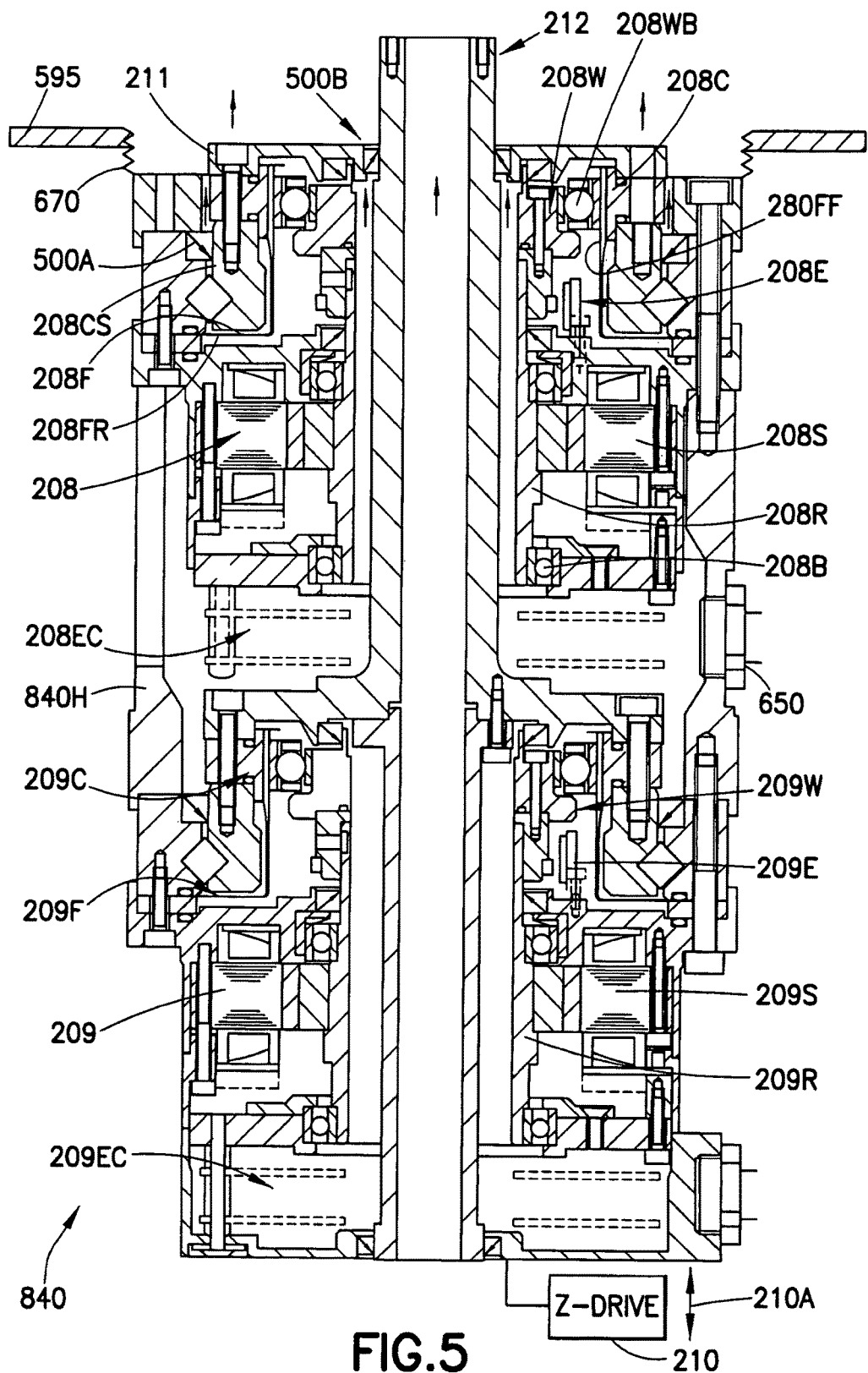
FIG. 5 is a schematic illustration of an exemplary drive system in accordance with an aspect of the disclosed embodiment.

Referring now to FIGS. 3-5 the high capacity transport may include at least one arm 800 having an upper arm 810, a forearm 820 and at least one end effector 830. It should be understood that while some aspects of the disclosed embodiment are described herein with respect to the arm 800 that other suitable arms, such as those described above, may be mounted to and driven by the drive systems described herein. The end effector 830 may be rotatably coupled to the forearm 820 and the forearm 820 may be rotatably coupled to the upper arm 810. The upper arm 810 may be rotatably coupled to, for example the drive section 840 of the transport apparatus. For exemplary purposes only, the drive section 840 may include a coaxial drive system where the drive shaft system includes any suitable number of coaxial drive shafts or spindles (the coaxial drive system shown in FIG. 5 has two coaxial shafts for example purposes, and in other aspects more or fewer shafts may be used). The drive section 840 may be sealingly mounted to an environmental flange 595 so that a sealed controlled environment SE, such as the interior of a transport chamber or other substrate processing environment, in which the arm 800 operates can be sealingly isolated from an atmospheric or external environment ATM external to the controlled environment SE and within a housing 840H of the drive section. Accordingly, the environment within the drive housing 840H may be atmospheric as will be described further below.

Figure 6:
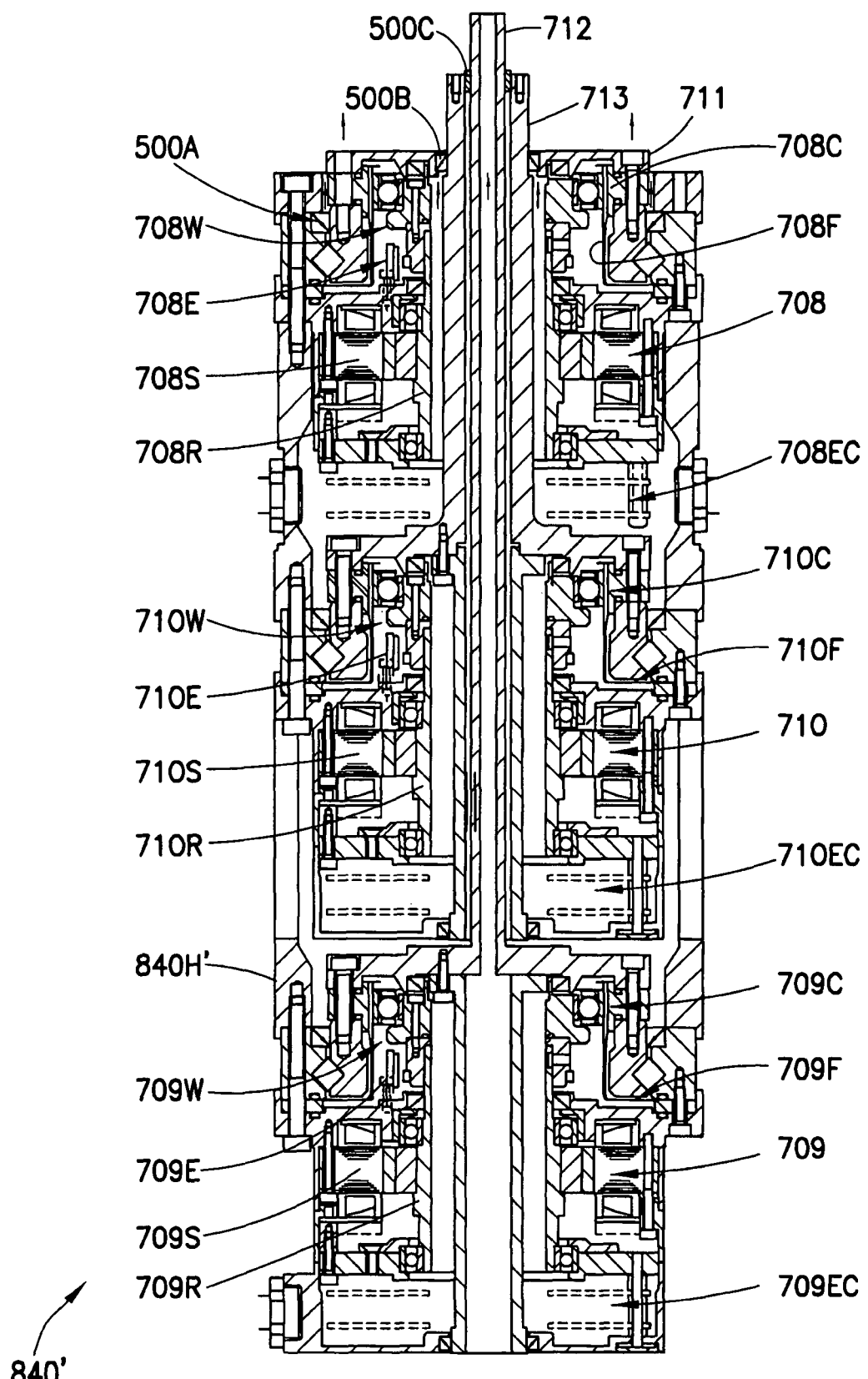
FIG. 6 is a schematic illustration of another exemplary drive system in accordance with an aspect of the disclosed embodiment.

The drive section 840 may be configured as a harmonic drive section. For example, the drive section 840 may include any suitable number of harmonic drive motors. The drive section 840 may be of any suitable shape and size such that the drive section 840 is interchangeable with non-harmonic type drive sections substantially without modification to the processing module in which the drive section 840 is being installed. In one aspect the drive section 840 shown in FIG. 5 includes two harmonic drive motors 208, 209, one motor for driving an outer shaft 211 and the other motor for driving an inner shaft 212. It is noted that in other aspects the drive section may include any suitable number of harmonic drive motors corresponding to, for example, any suitable number of drive shafts in the coaxial drive system. The harmonic drive motors 208, 209 may have high capacity output bearings such that the component pieces of a ferrofluidic seal, generally referred to as ferrofluidic seal 500, are centered and supported at least in part by the harmonic drive motors 208, 209 with sufficient stability and clearance during desired rotation T and extension R movements of the robot arm. It is noted that the ferrofluidic seal 500 may include several parts that form a substantially concentric coaxial seal as will be described below. In this example the drive section 840 includes a housing 840H that houses the two drive motors 208, 209 in series (e.g. in-line or one above the other on a common axis of rotation though in other aspects the motors may be nested in each other, or offset from each other and coupled via suitable transmissions to respective shafts of the coaxial shaft assembly) in a manner substantially similar to that described in U.S. Pat. Nos. 6,845,250; 5,899,658; 5,813,823; and 5,720,590, the disclosures of which are incorporated by reference herein in their entireties. The motors are arranged so that the uppermost motor 208 has a through hole therein (e.g. the motor rotor is mounted to the outer shaft) so that the lower motor 209 (or motors in the case of three or more coaxial drive shafts as shown in FIG. 6) has a drive shaft 212 that passes through the through hole to a drive end of the housing 840H. The ferrofluidic seal 500 can be toleranced to seal each drive shaft in the coaxial drive shaft assembly as shown and described further below. It is noted that the innermost drive shaft 712 may also have a hollow construction (e.g. has a hole running longitudinally along a center of the drive shaft) to allow for the passage of wires or any other suitable items through the coaxial drive assembly for connection to, for example, the arm assembly, such as arm 800, mounted to the drive 840. To seal the controlled atmosphere in which the arm 800 operates from an interior of the drive 840 (which may operate in an atmospheric pressure environment) the drive 840 may include an isolation wire feedthrough 590 that may allow the arm to rotate without damaging, for example, the wires. One suitable example of a wire feedthrough can be found in U.S. Pat. No. 6,265,803 the disclosure of which is incorporated herein by reference in its entirety.

Referring now to FIGS. 3 and 5, the two motors 208, 209 may allow movement of the arm 800 such that the arm has at least two degrees of freedom (i.e. rotation, which is generally referred to as T motion, about, for example, the Z-axis and extension in, for example the X-Y plane, which is generally referred to as R motion as shown in FIG. 3). In other aspects, the drive section 840 may also include a Z-axis motor 210 for allowing the drive section to move in the direction of arrow 210A for raising and lowering, for example, the arm 800 and the end effector 830 located thereon relative to a substrate transport plane or substrate holding station. As may be realized, where a Z-axis motor 210 is used the robot arm drive system may include any suitable flexible connection between, for example, the housing 840H of the drive system and the environmental flange 595. In one aspect the flexible connection may be a bellows 670 but in other aspects any suitable connection may be used.

While the coaxial shaft or spindle is illustrated as having two drive shafts 211, 212 in other aspects the spindle may have more or less than two drive shafts. Still in other aspects the drive shafts may have any suitable configuration. In this example, the outer shaft 211 of the coaxial drive shaft may be suitably coupled to upper arm 810 and the inner shaft 212 may be suitably coupled to the forearm 820. In this example the end effector 830 may be operated in a "slaved" configuration but in other aspects (see e.g. FIG. 6) an additional drive shaft may be included in the drive unit to operate the end effector 830. As may be realized, the drive shafts may be configured to provide a common arm interface for mounting different arm configurations (such as those described above) to the harmonic drive system.

As described above, each of the motors 208, 209 are mounted within the housing 840H in a concentrically stacked configuration so that the motors are located in line with each other. The motors may be any suitable types of alternating current (AC) motors or direct current (DC) motors such as for example, servo motors, stepper motors, AC induction motors, DC brushless motors, DC coreless motors or any other suitable motor. In this exemplary embodiment, motor 208 may include a stator 208S fixedly mounted within the housing 840H and a rotor 208R rotatably mounted within the housing 840H in any suitable manner such as with bearings 208B. A cam member or what may be referred to as a wave generator 208W may be mounted to the rotor 208R in any suitable manner so as to rotate 208R in unison with the rotor 208R. The wave generator 208W may include suitable ball bearings 208WB built into the outer circumference of a generally elliptical cam. The inside raceway of the bearing is fixed to the cam while the outer raceway is subjected to the elastic deformation via the ball bearings 208WB. A first spline member 208F may be fixedly supported within the housing 840H in any suitable manner so that the first spline member 208F is rotationally fixed to the housing 840H. The first spline member may have a substantially rigid portion 208FR and a substantially flexible portion 208FF that form a substantially torsionally rigid structure. The spline member 208F, though flexible locally under action by the cam, may also provide desired whole body rigidity to substantially fix the centerline position of the shaft assembly under the range of R, T motion of the arm (e.g. axis Z in FIG. 3) and hence maintain desired gaps within the ferrofluidic seal(s). The first spline member 208F may be mounted to the housing through the substantially rigid portion 208FR. A second spline member 208C may be mounted to a respective one of the coaxial shafts. Here the second spline member 208C is coupled to the outer shaft 211 in any suitable manner so that the outer shaft 211 and the second spline member 208C rotate as a unit. The second spline member 208C may have the form of a substantially rigid ring. The first spline member 208F may have gear teeth formed around an outer circumference of the flexible portion 208FF of the first spline member 208F. The second spline member 208C may also have teeth that are formed around an inner circumference of the second spline member 208C. As the rotor 208R is turned the wave generator cams the flexible portion 208FF of the first spline member 208F to locally deflect so that the gear teeth of the first spline member 208F meshingly engage the gear teeth of the second spline member 208C. However, because of the elliptical shaped cam of the wave generator only the teeth of the first spline member 208F that are aligned with a major axis of the wave generator ellipse engage the teeth of the second spline member 208C while the teeth of the of the first spline member 208F along the minor axis of the wave generator ellipse are substantially completely disengaged from the gear teeth of the second spline member 208C. There may also be fewer teeth on the first spline member 208F than on the second spline member 208C (or vice versa) which causes rotational movement of the second spline member 208C relative to the first spline member 208F which in turn causes a rotation of the drive shaft 211. The torsional rigidity of the first spline member(s) and/or a speed reduction provided by the harmonic drive may allow for increased torque profiles for driving the links of the robot arm mounted to the drive system. As may be realized the drive shaft 211 may be axially supported in the direction of arrow 210A any suitable manner. In one aspect, the drive shaft 211 may be supported in the direction of arrow 210A by the harmonic drive 208. In other aspects the drive shaft 211 may be supported in the direction of arrow 210A by any suitable bearings. In still other aspects the drive shaft 211 may be supported in the direction of arrow 210A by a combination of the harmonic drive 208 and suitable bearings.

Motor 209 may be substantially similar to motor 208 in form and operation in that the motor 209 may also include a stator 209S, a rotor 209R, a wave generator 209W, a first spline member 209F and a second spline member 209C all of which are substantially similar to respective ones of the stator 208S, rotor 208R, wave generator 208W, first spline member 208F and second spline member 208C described above with respect to motor 208. The inner drive shaft 212 may be fixedly coupled to the second spline member 209C in any suitable manner so that the inner drive shaft 212 and the second spline member 209C rotate as a unit. In a manner substantially similar to that described above the drive shaft 212 may be axially supported in the direction of arrow 210A any suitable manner. In one aspect, the drive shaft 212 may be supported in the direction of arrow 210A by the harmonic drive 209. In other aspects the drive shaft 212 may be supported in the direction of arrow 210A by any suitable bearings. In still other aspects the drive shaft 212 may be supported in the direction of arrow 210A by a combination of the harmonic drive 209 and suitable bearings.

As may be realized, the concentricity of the inner and outer drive shafts 211, 212 relative to each other and with the ferrofluidic seal(s) isolating the shaft assembly and housing from the controlled environment SE may be maintained through the interaction between respective gears of the first and second spline members 208F, 208C, 209F, 209C of the harmonic drives 208, 209 for controlling the gap between the shafts and a portion of the housing so that the ferrofluidic seal 500 may be maintained (e.g. the harmonic drives 208, 209 substantially concentrically locate the respective drive shafts relative to one another and at least a portion of the housing for allowing one or more ferrofluidic seals to be located between the shafts and one or more shafts and the housing). For example, as described above, the second spline member 208C, 209C of each motor 208, 209 may be a substantially rigid ring. The deformation of the first spline members 208F, 209F against a respective one of the second spline members 208C, 209C (which causes the teeth to mesh) may hold the shafts 211, 212 which are coupled to a respective one of the second spline members 208C, 209C substantially concentric with each other and substantially concentric with at least a portion of the housing 840H. As may be realized in other aspects bearings may be placed between, for example, the drive shafts or any other suitable location within the drive system for maintaining substantial concentricity between the drive shafts depending in conjunction with the harmonic drives.

As described above, the harmonic drives 208, 209 allow for the use of a substantially concentric coaxial ferrofluidic seal 500 (or any other suitable seal) in the drive system 840 for isolating the sealed controlled environment in which the robot arm, such as arm 800 (which may be mounted to the drive shafts of the drive system 840), operates from the atmospheric pressure environment within the drive system housing 840H and other external environments. The harmonic drive system may be configured to substantially minimize runout of the drive shafts for tightly controlling the gap(s) in which the ferrofluidic seal(s) may be located. Still referring to FIG. 5 a first ferrofluidic seal 500A may be located between, for example, the second spline member 208C and a portion of the housing 840H. In one example, the second spline member 208C of the harmonic drive 208 may include a ferrofluidic sealing surface 208CS for at least in part maintaining the first ferrofluidic seal 500A. A second ferrofluidic seal 500B may be located between the outer drive shaft 211 and the inner drive shaft 212. As such, an atmospheric barrier is formed between the harmonic drive 208 and the housing 840H and between the outer shaft 211 and inner shaft 212 for sealingly isolating the sealed controlled environment on the output side of the drive system 840 from the atmospheric environment within the drive system 840. As may be realized, in this aspect, an output portion of the harmonic drives 208, 209 is sealingly isolated by, for example, the ferrofluidic seals 500A, 500B from the input portion of the harmonic drives 208, 209. Conversely, as noted, the ferrofluidic seals depend from (at least in part) an output portion 208CS, or a portion (e.g. outer surface of inner shaft 212) dependent from an output portion of the harmonic drive. It is noted that while two ferrofluidic seals 500A, 500B are described with respect to drive system 840, in other aspects there may be more or less than two ferrofluidic seals located in any suitable locations within the housing 840H for substantially sealing the sealed controlled environment from the atmospheric environment. The ferrofluidic seals 500A, 500B may be provided at the interface(s) of the housing 840H where the sealed controlled environment and the atmospheric environment can interact so that particulates generated inside the housing 840H by the drive system 840 cannot escape into the sealed controlled environment, any corrosive materials of the controlled sealed environment cannot get into the housing 840H and so that when used in a vacuum, the internal components of the drive system 840 located within, for example, the housing 840H need not be vacuum compatible because the ferrofluidic seals 500 provide an atmospheric barrier. Again it is noted that the arrangement of the ferrofluidic seals 500A, 500B of drive system 840 is exemplary only and in alternate embodiments the ferrofluidic seals may have any other suitable arrangement and configuration.

One or more suitable absolute or incremental encoders 208E, 209E or any other suitable position tracking device(s) may be located at any suitable positions at least partly within the housing for tracking a rotation of a respective one of the harmonic drives 208, 209 so that the robot arm, such as arm 800, can be accurately positioned. One or more encoder conversion units 208EC, 209EC may be located within the housing 840H for converting signals from a respective encoder 208E, 209E for use by, for example, any suitable controller, such as controller 170. The housing 840H may have one or more wire feedthroughs 650 for allowing electrical connection to the encoders 208E, 209E and/or stators 208S, 209S or any other suitable electronic component located within the housing 840H. It should be understood that the arrangement of the encoders, encoder conversion units and feedthroughs is exemplary only and in alternate embodiments the encoders, encoder conversion units and feedthroughs may have any suitable arrangement and or configuration.

Another harmonic drive system incorporating aspects of the disclosed embodiment is shown in FIG. 6. The drive section 840' includes a three shaft or triaxial shaft assembly with three harmonic drive motors 708, 709, 710 where each motor drives a respective one of the inner shaft 712, middle shaft 713 and outer shaft 711. In this example, the outer shaft 711 of the coaxial drive shaft may be suitably coupled to upper arm 810, of for example, arm 800 and the inner shaft 712 may be suitably coupled to the end effector 830 and the middle shaft may be suitably coupled to the forearm 820 so that each of the arm links can be independently rotated. Each of the motors 708, 709, 710 may be substantially similar to motors 208, 209 described above in that each motor 708, 709, 710 include a stator 708S, 709S, 710S, a rotor 708R, 709R, 710R, a wave generator 708W, 709W, 710W, a first spline member 708F, 709F, 710F and a second spline member 708C, 709C, 710C all of which are substantially similar to respective ones of the stator 208S, 209S, rotor 208R, 209R, wave generator 208W, 209W, first spline member 208F, 209F and second spline member 208C, 209C described above with respect to motors 208, 209. The inner shaft 712 may be hollow for allowing a substantially sealed feedthrough for wires or any other suitable objects into, for example, one or more links of the robot arm 800, in a manner substantially similar to that described above with respect to shaft 212.

In this aspect, motor 708 drives the outer shaft 711, motor 709 drives the inner shaft 712 and motor 710 drives the middle shaft in a manner substantially similar to that described above with respect to FIG. 6. As described above, the concentricity of the shafts relative to each other and/or the housing 840H' may substantially be maintained by the harmonic drive motors 708, 709, 710. For example, as described above, the respective interactions between the first and second spline members 708F, 708C, 709F, 709C, 710F, 710C may control the gap between the shafts and a portion of the housing so that a ferrofluidic seal 500 may be maintained (e.g. the harmonic drives 708, 709, 710 substantially concentrically locate the respective drive shafts relative to one another and at least a portion of the housing for allowing one or more ferrofluidic seals to be located between the shafts and one or more shafts and the housing). Again, as described above, in other aspects, suitable bearings may be placed between the drive shafts or at any other suitable location within the housing 840H' for maintaining substantial concentricity between one or more of the shafts and/or between a portion of the housing and one or more of the shafts in conjunction with the harmonic drive motors 708, 709, 710.

While some aspects of the disclosed embodiment were described with respect to a vacuum robot and drive system it should be understood that the exemplary drive systems of the exemplary embodiments could be equally applied to atmospheric robots. As may be realized, where an atmospheric boundary is not required with respect to an interior of the drive system housing the ferrofluidic seals, for example, may be replaced with any other suitable seals.

In this exemplary embodiment, ferrofluidic seal 500A may be located between the spline member 708C and a portion of the housing in a manner substantially similar to that described above. Ferrofluidic seal 500B may be located between the outer shaft 711 and the middle shaft 713 in a manner substantially similar to that described above. An additional ferrofluidic seal 500C may be provided between middle shaft 713 and the inner shaft 712 in a manner substantially similar to that described above with respect to ferrofluidic seal 500B. In this manner an output portion of each of the harmonic drives 708, 709, 710 may be sealingly isolated from an input portion of the drives 708, 709, 710.

As may be realized suitable position tracking device(s) such as encoders 708E, 709E, 710E and encoder conversion units 708EC, 709EC, 710EC (which may be substantially similar to encoders 208E, 208E and conversion units 208EC, 209EC) may be located at least partly within the housing for tracking the rotation of the harmonic drives 708, 709, 710 in a manner substantially similar to that described above. The location of the encoders and encoder conversion units is merely exemplary and in other aspects may be located in any suitable locations for tracking the position of respective ones of the drive motors 708, 709, 710.

Figure 7A:
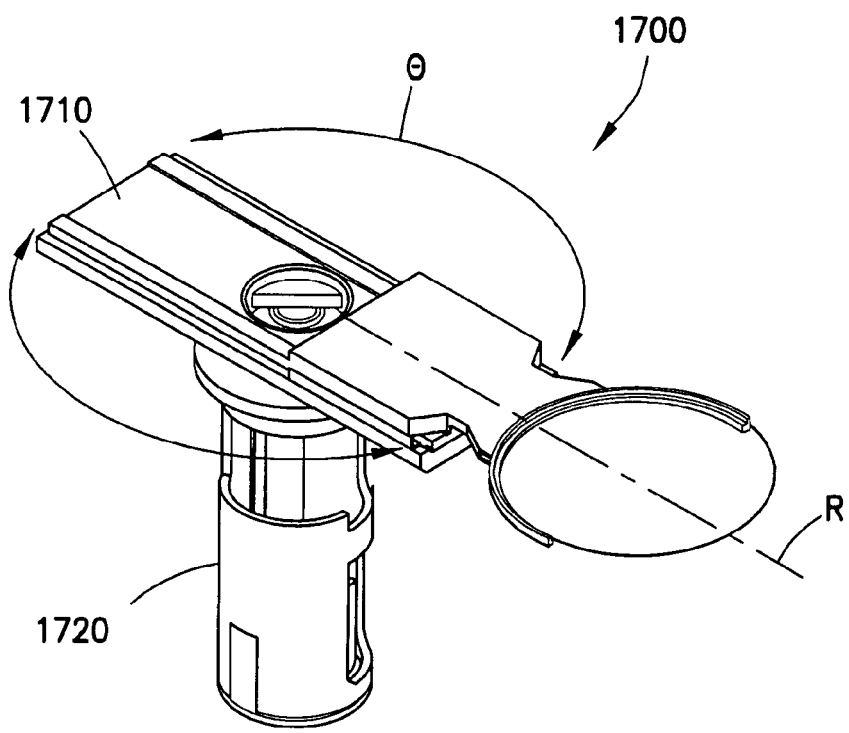
FIGS. 7A and 7B are schematic illustrations of a substrate transport apparatus in accordance with an aspect of the disclosed embodiment.
Figure 7B:
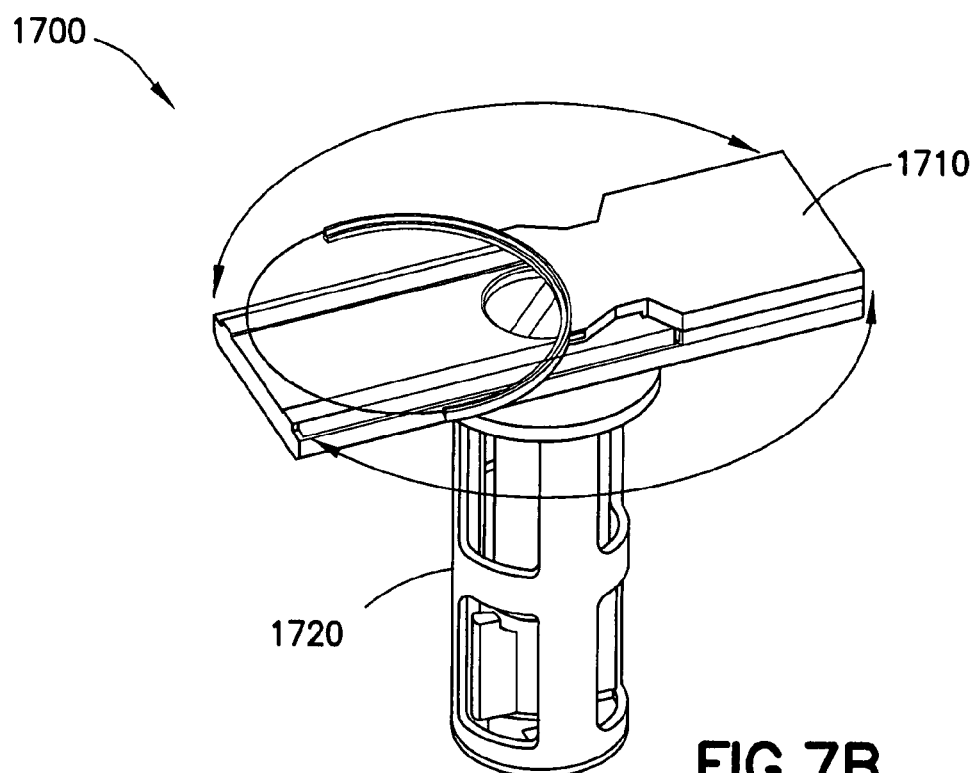

Referring now to FIGS. 7A and 7B, another high capacity substrate transport apparatus 1700 is shown incorporating aspects of the disclosed embodiment. Here the transport apparatus 1700 may be configured for operation in an atmospheric environment and include an arm assembly 1710 and a drive section 1720. In other aspects the transport apparatus may be suitably configured for operation in a vacuum environment. In one aspect the arm assembly 1710 may have unlimited theta θ rotation as will be described below and be suitable sized to allow for any suitable predetermined reach of the arm.

Figure 8A:
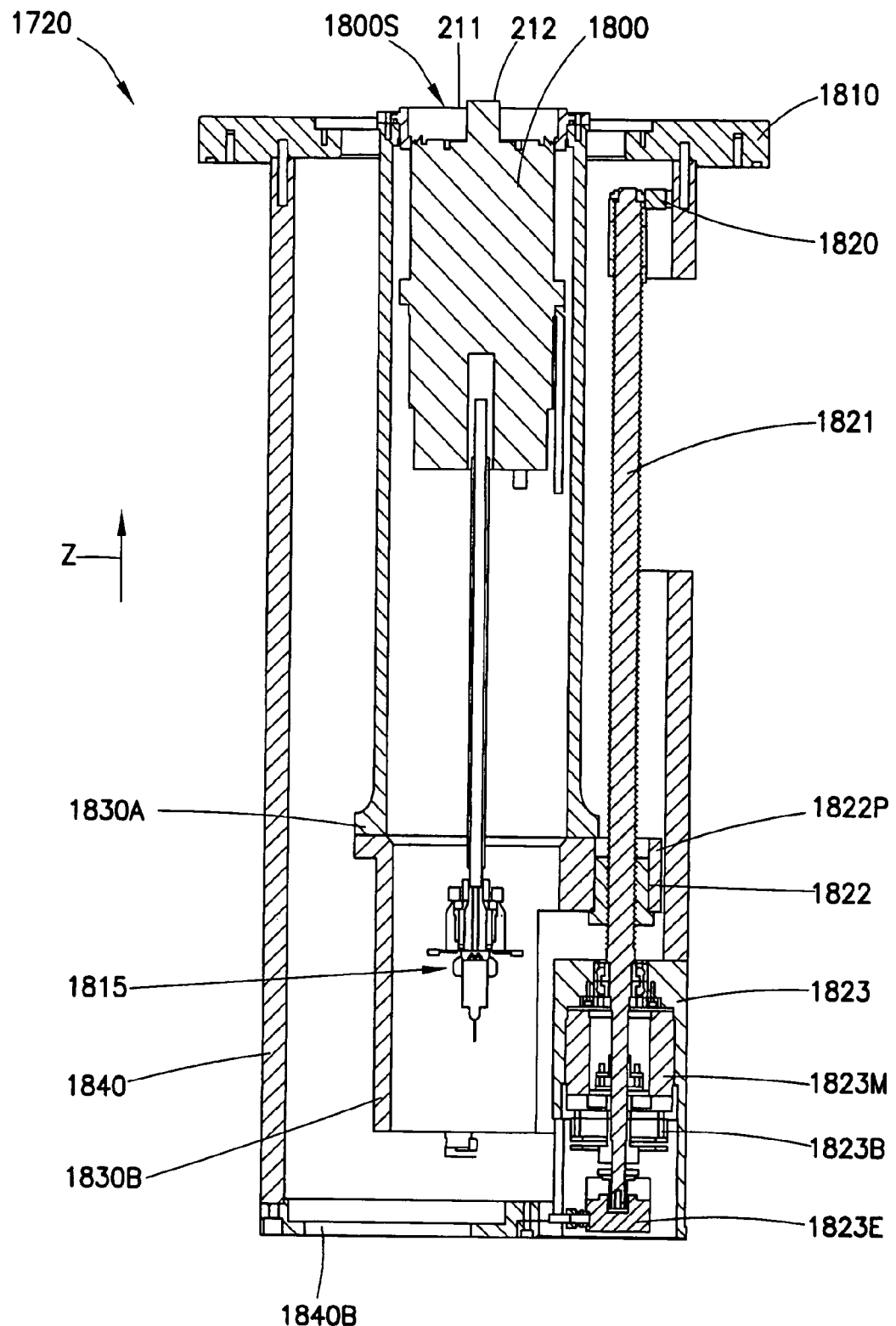

Referring also to FIGS. 8A-8C the drive section 1720 includes a drive system chassis 1840 fixedly attached to a mounting flange 1810 that may be substantially similar to flange 595 described above (FIG. 5). The chassis may also include a lower support plate 1840B configured to support at least part of the drive system. A Z-axis drive 1823 may be mounted at least partially to the lower support plate 1840B so that a ball screw 1821 extends towards the flange 1810 and is supported on its non-driven end by any suitable support bearing 1820. The Z-axis drive 1823 may include any suitable drive motor 1823M for rotating the ball screw 1821. For example, the drive motor 1823M may be any suitable types of alternating current (AC) motors or direct current (DC) motors such as for example, servo motors, stepper motors, AC induction motors, DC brushless motors, DC coreless motors or any other suitable motor. The Z-axis drive may also include any suitable breaking mechanism 1823B for haulting the rotation of the ball screw 1821 and hence the Z-axis movement of the arm 1710 (which is coupled to the drive 1800 as will be described below). The Z-axis drive 1823 may also include any suitable position tracking device such as, for example, any suitable encoder for tracking the Z-axis position of the arm 1710 by sending suitable signals to, for example, any suitable controller such as controller 170 (FIG. 1). It should be understood that while a ball screw Z-axis drive is described and shown in FIGS. 8A-8C that in other aspects the Z-axis drive may include any suitable type of drive system including a fluid driven slide mechanism, solenoid, a magnetically driven slide mechanism or any other suitable linear drive.

The drive system shown in FIGS. 8A-8C includes spindle assembly 1800S moveably mounted within the chassis 1840 such that at least part of the spindle assembly 1800S moves freely through the flange along the Z-axis. The spindle assembly 1800S includes a harmonic drive assembly 1800 which in one aspect is substantially similar to harmonic drive 840 (described above (FIG. 5). In other aspects where more than two drive axes are desired the harmonic drive assembly 1800 may be substantially similar to harmonic drive 840'. The harmonic drive 1800 may be fixedly mounted within a spindle support tube 1830A in any suitable manner. The spindle support tube 1830A may in turn be fixedly coupled to a Z-axis carriage 1830B in any suitable manner. While the spindle support tube 1830A and the Z-axis carriage 1830B are shown as separate units, in other aspects the spindle support tube and Z-axis carriage may be formed in a one-piece unitary construction. The Z-axis carriage 1830B may include a protrusion 1822P that includes a ball screw nut 1822 for connecting the spindle assembly 1800S to the Z-axis drive 1823 such that the spindle assembly 1800S is moved along the Z-axis in response to rotation of the ball screw 1821 by the Z-axis drive 1823. The z-axis carriage 1830B may also include protrusions 1860A, 1860B located at any suitable angular positions along the periphery of the Z-axis carriage 1830B. In this example, the protrusions 1860A, 1860B are located substantially one-hundred-eighty degrees (180°) apart but in other aspects the protrusions may have any suitable angular relation with each other and with the protrusion 1822P. One or more guiding members 1865A, 1865B may be located in respective ones of the protrusions 1860A, 1860B for slidably cooperating with, for example, guide rails 1850A, 1850B for guiding the Z-axis movement of the spindle assembly 1800S within the chassis 1840. The guide rails 1850A, 1850B may have any suitable configuration and may be mounted in any suitable manner within the chassis 1840. In other aspects any suitable guiding features may be used to guide the Z-axis movement of the spindle 1800S within the chassis 1840.

Any suitable slip ring 1815 or other suitable wire feedthrough may be provided within the spindle assembly 1800S so that wires or other suitable cables, tubes, etc. can be passed through the spindle assembly 1800S, in a manner substantially similar to that described above, into the arm 1710 substantially without impeding the unlimited theta θ rotation of the arm 1710.

Figure 9B:
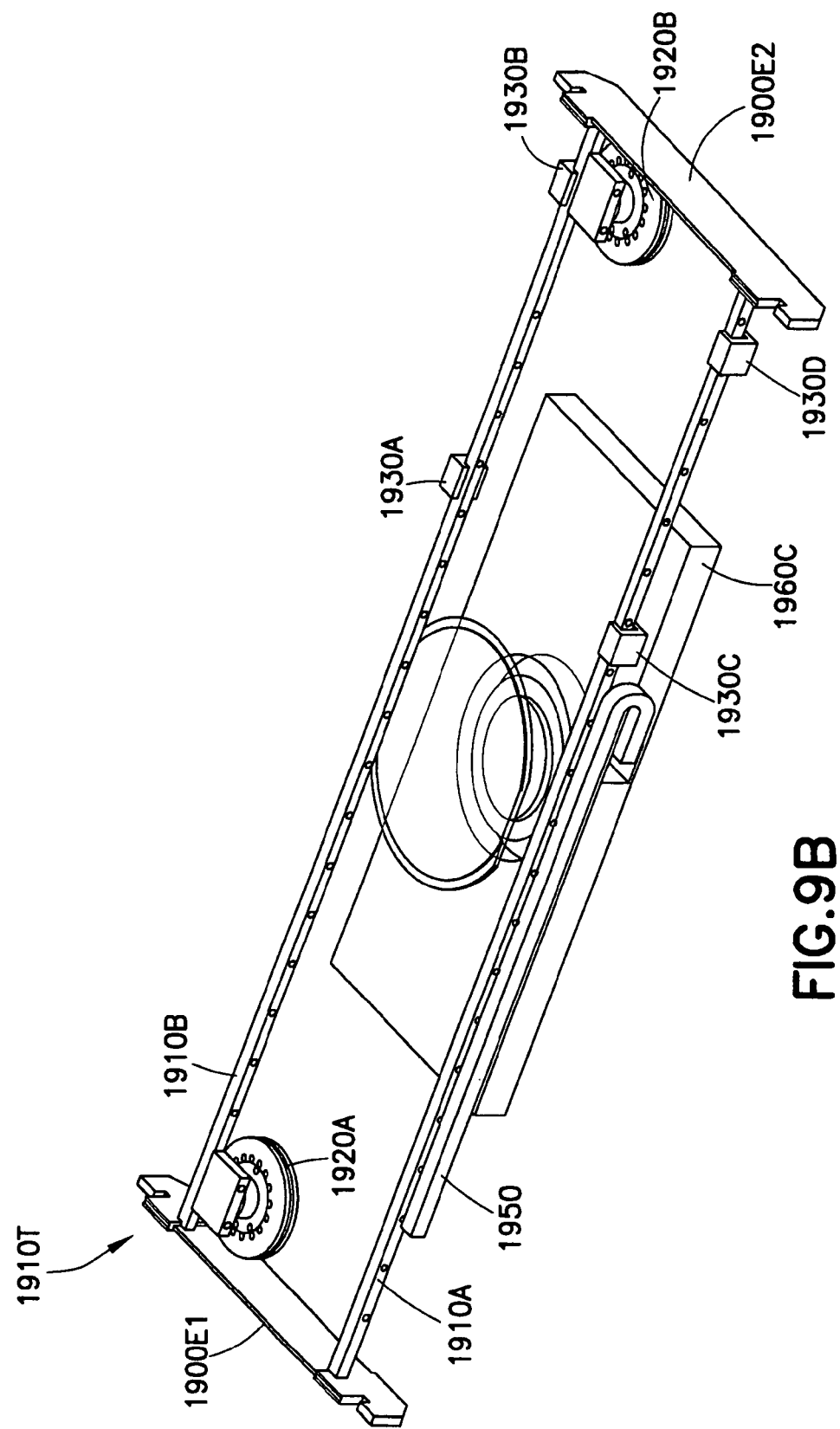
Figure 10:
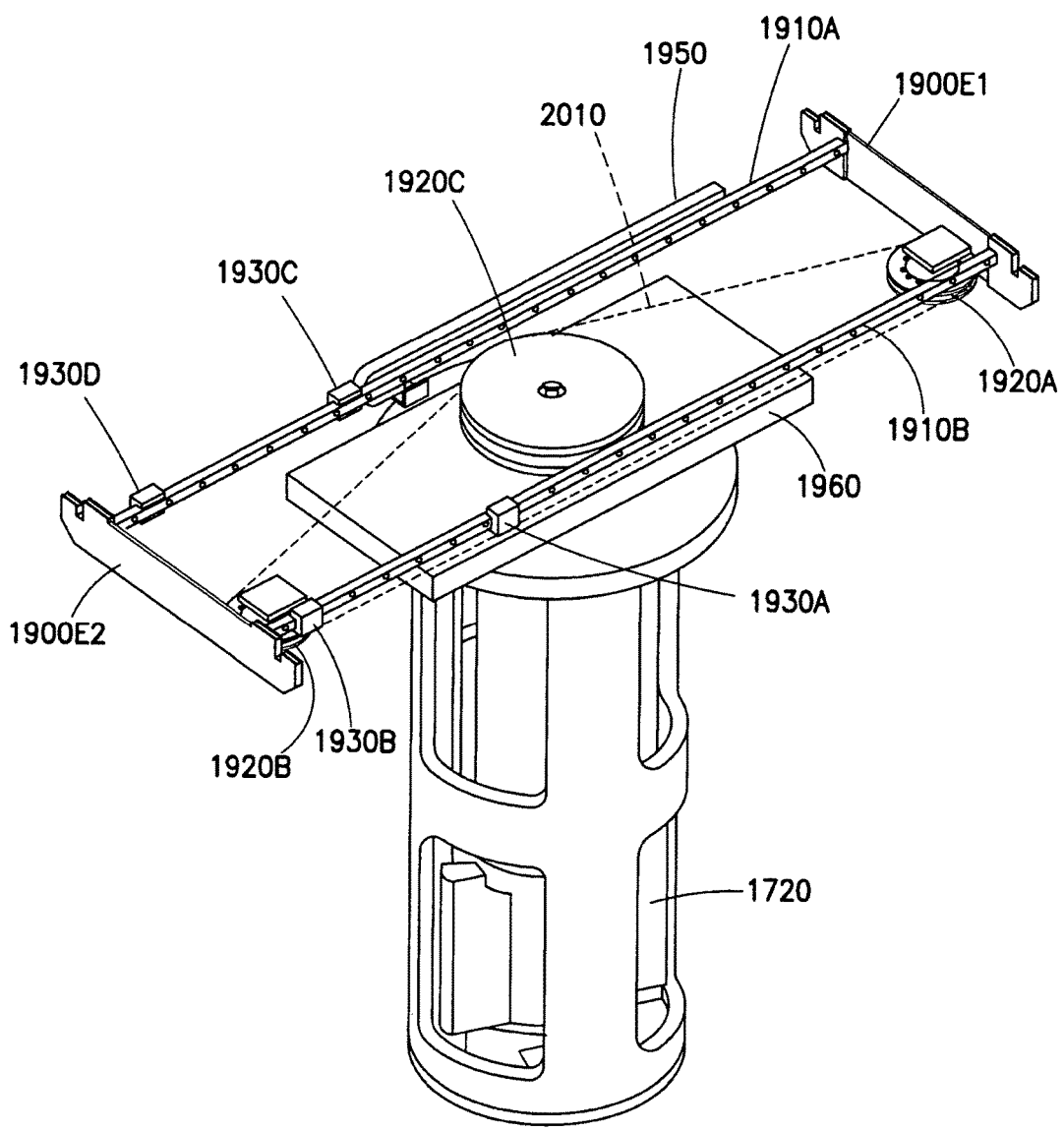
FIG. 10 is a schematic illustration of a portion of the substrate transport apparatus of FIGS. 7A and 7B.

Referring also to FIGS. 9A, 9B and 10 the arm 1900 may include an upper arm portion 1901 including a base member 1960, a lower housing 1900L and an upper housing 1900U. The arm 1900 may also include a travel frame 1910T and an end effector 1905. The base member 1960 is configured to be fixedly coupled to, for example, the outer drive shaft 211 of the drive 1800 such that as the outer drive shaft 211 rotates the base member 1960 rotates with it. The base member 1960 may be coupled to the drive shaft 211 in any suitable manner such as through mechanical fasteners. The travel frame 1910T may be mounted to base member 1960 in any suitable manner such that the travel frame 1910T is fixed to the base member 1960. For example, the travel frame 1910T may include one or more guide rails 1910A, 1910B where each rail is coupled at each end to a respective end plate 1900E1, 1900E2 in any suitable manner. One or more guiding members 1930A, 1930B, 1930C, 1930D may be slidingly coupled to each guide rail 1910A, 1910B. Each guide rail and/or end plates 1900E1, 1900E2 may include mounting brackets or other suitable mounting feature for coupling the travel frame 1910T to the base member 1960 substantially without interfering with the sliding movement of the guiding members 1930A, 1930B, 1930C, 1930D along their respective guide rails 1910A, 1910B. The upper and lower housings 1900U, 1900L may be mounted to one or more of the end plates 1900E1, 1900E2, the base member 1960 and to each other to substantially enclose or house, in conjunction with the end plates 1900E1, 1900E2, the guide rails 1910A, 1910B, the guiding members 1930A-1930D and the arm extension/retraction drive components (described below). As may be realized the upper and lower housings 1900U, 1900L may be configured such that when assembled on the arm 1900 a slit 1999 is formed between the upper and lower housings 1900U, 1900L to allow for a connection between the end effector 1905 and the guiding members 1930A-1930D. For example, one or more connecting member 1905C may extend through the slit 1999 and connect the end effector 1905 to the guiding members 1930A-1930D (as will be described in greater detail below) so that movement of the guiding members 1930A-1930D along the rails 1910A, 1910B causes the end effector 1905 to extend and retract along the radial axis R (FIG. 7A).

Referring also to FIG. 10, the guiding members may be driven by the inner drive shaft 212 of the drive 1800 in any suitable manner. For example, a drive pulley 1920C may be mounted to the inner drive shaft 212 so that as the inner drive shaft 212 rotates the pulley 1920C rotates with it. One or more of the guide rails 1910A, 1910B may include guide pulleys 1920A, 1920B located on opposite ends of a respective rail 1910A, 1910B. It is noted that while the guide pulleys 1920A, 1920B are shown only on the guide rail 1910B in FIG. 10 in other aspects guide pulleys may also be located on guide rail 1910A. One or more suitable transmission members 2010, such as a belt, band, wire, etc. may be routed around the drive pulley 1920C and each of the guide pulleys 1920A, 1920B. One or more of the guiding members, in this example, guiding members 1930A, 1930B, and the connecting member 1905C may be fixedly coupled to the transmission members 2010 so that as the drive pulley 1920C rotates the transmission member is caused to move linearly between the guide pulleys 1920A, 1920B. The linear movement of the transmission member 2010 between the guide pulleys 1920A, 1920B causes the end effector to extend and retract along the radial axis R due to, for example, the fixed coupling between the transmission member 2010 and one or more of the guiding members 1930A, 1930B and connecting member 1905C. In one aspect it is noted that any suitable sealing members may be provided in the slit 1999 to substantially prevent any particles from exiting the slit 1999 into a chamber in which the arm 1900 operates. In another aspect, vacuum tubes or other air circulating/particle removal apparatus may be provided within the arm 1900 for capturing and removing any particles that may be generated by, for example, the pulleys and transmissions within the arm 1900.

The end effector 1905 may be any suitable end effector such as, for example, an edge grip end effector or a bottom grip end effector with active or passive gripping. In one aspect the end effector 1905 includes a base portion 1905B and a gripper portion 1905G. The base portion 1905B may be coupled to the one or more connecting members 1905 (in the example, shown one connecting member is located on each lateral side 1905BS of the base portion 1905B). The connecting members 1905C may be coupled to the guiding members 1930A-1930B such that the base portion 1905B is stably held by the travel frame 1910T. The gripper portion 1905G of the end effector 1905 is shown in this example, as an edge grip end effector but as noted above in other aspects the gripper portion may have any suitable configuration for supporting and gripping a substrate S. In one aspect, the gripper portion 1905G may be removably mounted to the base portion 1905B while in other aspects the gripper portion 1905G may be formed in a one-piece unitary construction with the base portion 1905B. Where electrical, pneumatic, vacuum, optical or other connections are desired, such as for controlling active gripping or for operation of substrate sensors located on the end effector 1905, the wires, tubes, cables, etc. may be routed through the spindle 1800S into a substantially flexible passage 1950 for connection to the end effector where the flexible passage 1950 is configured to bend or otherwise change shape to allow for the extension and retraction of the end effector without binding of the flexible passage within the arm 1900.

It is noted that while the arm 1900 is described above as having a "single stage" of extension (e.g. a base member and a single sliding member) in other aspects the arm 1900 may include a "multi-stage" extension as shown in FIG. 9C. For example, the arm may include the upper arm portion 1901. One or more intermediary arm sections 1903 may be sliding mounted to the upper arm portion 1901 in a manner substantially similar to that described above with respect to the end effector 1905. The end effector 1905 may be slidably mounted to the distal-most intermediary arm section 1903, e.g. when the arm is extended, in a manner substantially similar to that described above for mounting the end effector to the upper arm portion 1901. As may be realized the arm 1900 may include any suitable transmission system for causing the extension of the end effector 1905 through the extension of both the end effector and any suitable number of intermediary arm sections relative to the upper arm portion 1901. In other aspects the transport apparatus may have multiple arms or substrate holders, such as, arms/substrate holders that are stacked one above the other in a manner similar to that described below where each arm is driven (e.g. extended and retracted) by a respective drive shaft of the drive system. The multiple arms/substrate holders can be configured to extend in the same direction or in opposite directions.

Figure 11A:
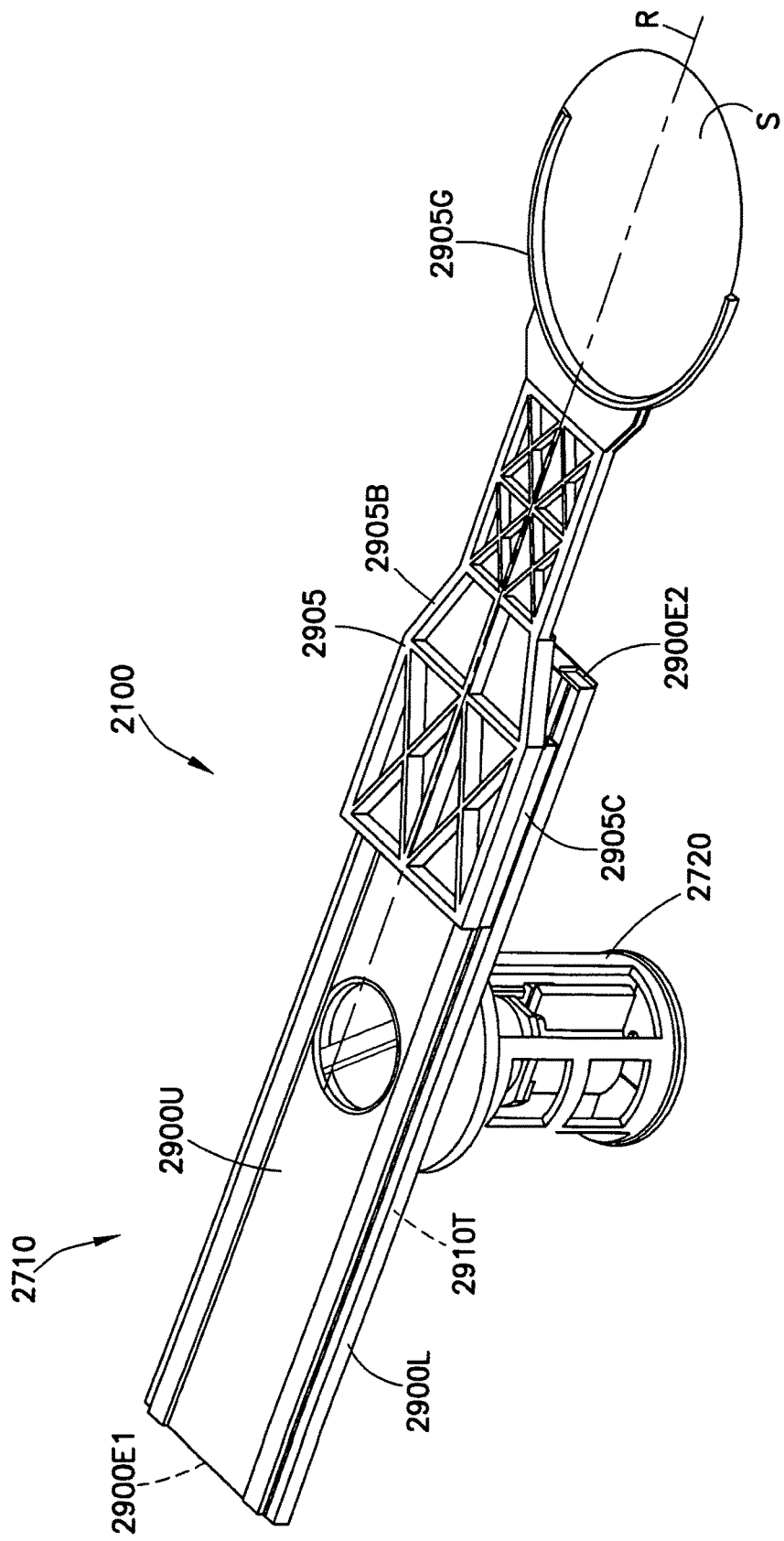
FIGS. 11A-11C are schematic illustrations of a transport apparatus in accordance with an aspect of the disclosed embodiment.
Figure 11B:
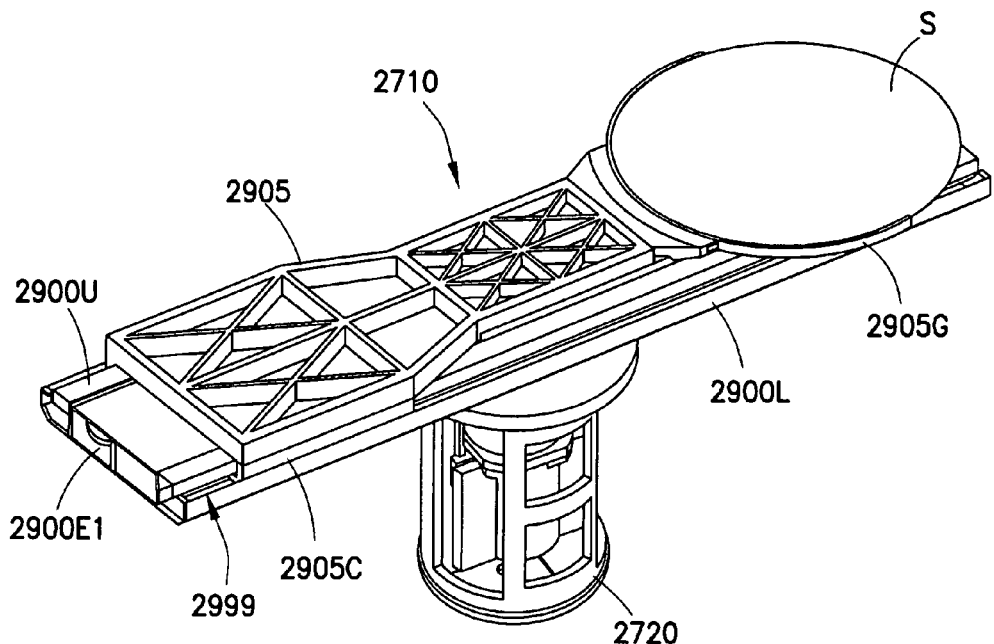
Figure 11C:
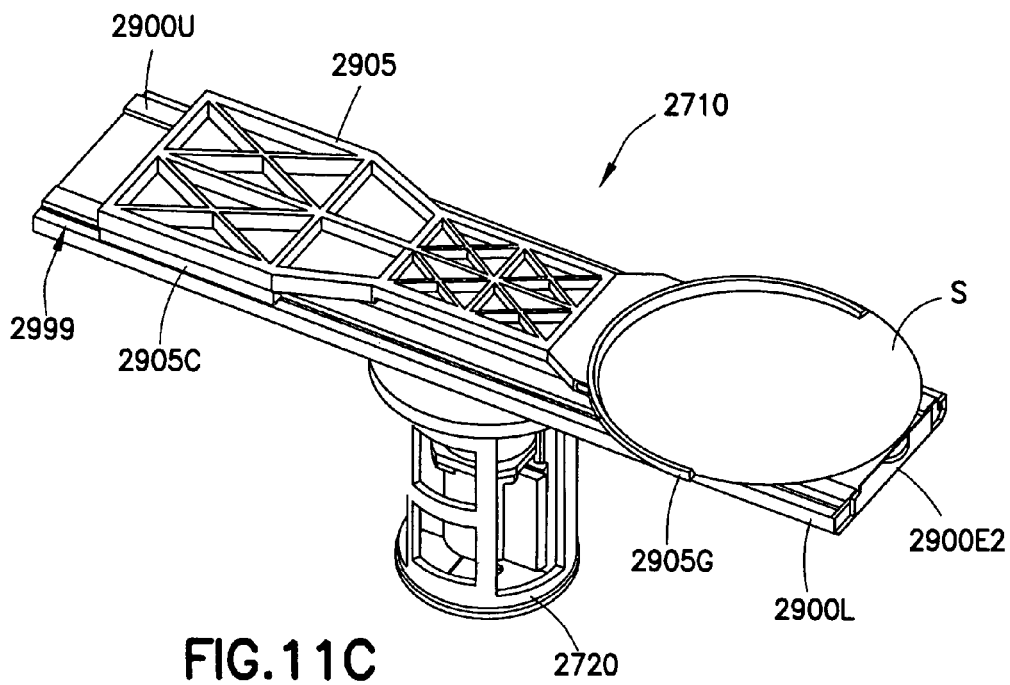
Figure 12C:
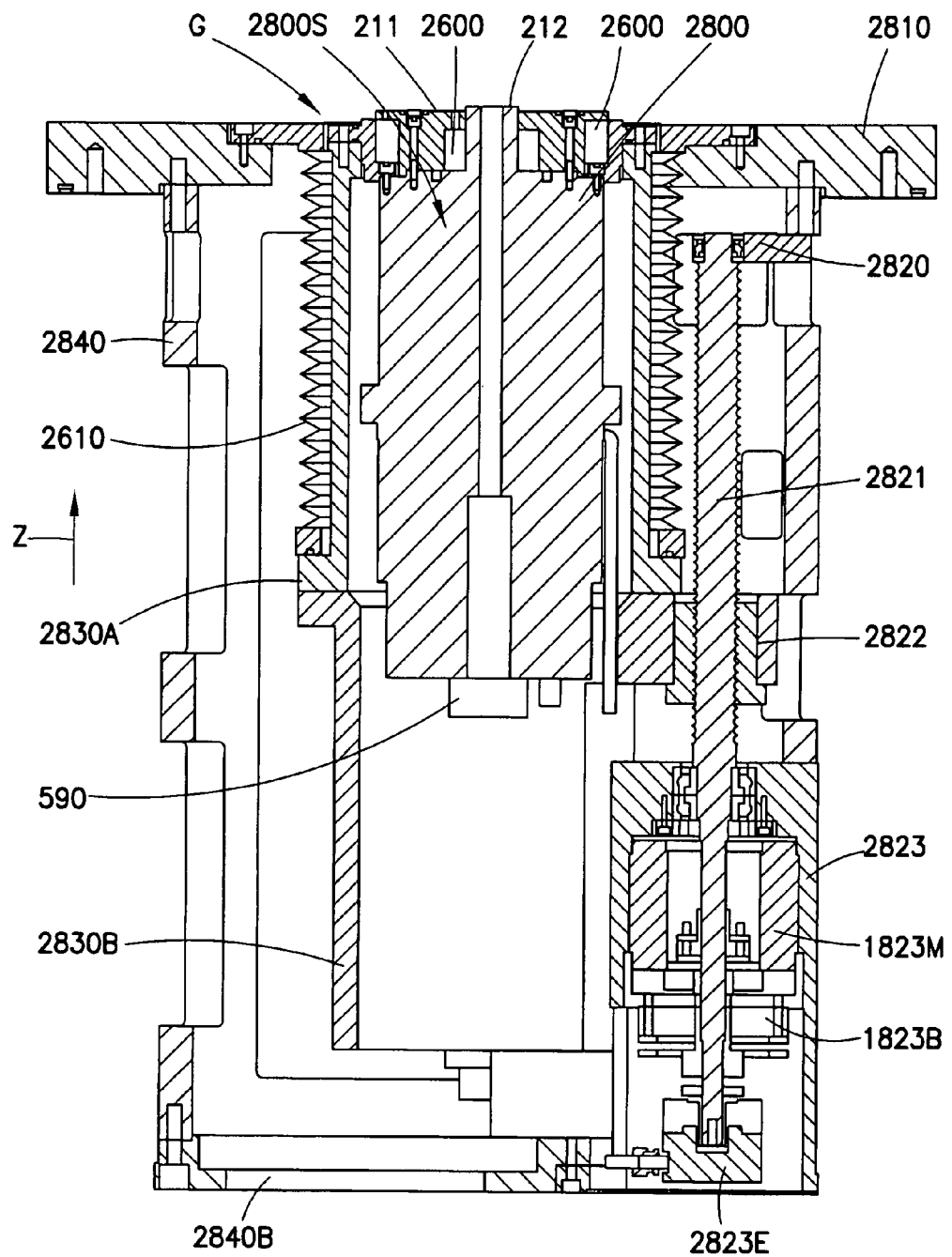

Referring now to FIGS. 11A-11C a high capacity transport apparatus 2100 is shown in accordance with another aspect of the disclosed embodiment. The transport apparatus 2100 may be substantially similar to transport apparatus 1700 unless otherwise noted. For example, the arm 2710 is substantially similar to arm 1710 and includes a base member (not shown), a lower housing 2900L, an upper housing 2900U, a travel frame 2910T and an end effector 2905. As described above, the base member is configured to be fixedly coupled to, for example, an outer drive shaft 211 (FIGS. 12A-12C) of the drive system 2720 such that as the outer drive shaft 211 rotates the base member rotates with it. The base member may be coupled to the drive shaft 211 in any suitable manner such as through mechanical fasteners. The travel frame 2910T (including ends 2900E1, 2900E2) may be substantially similar to travel frame 1910T and be mounted to base member in any suitable manner such that the travel frame 2910T is fixed to the base member. The end effector 2905 includes a base portion 2905B and a gripper portion 2905G that are substantially similar to the base portion 1905 and gripper portion 1905G of end effector 1905 described above. The end effector 2905 may be connected to guiding members of the travel frame through connecting members 2905C in a manner substantially similar to that described above so that the end effector is extended and retracted along radial axis R also in a manner substantially similar to that described above. For example, the slit 2905C may include a seal configured to prevent particles generated by, for example, the pulleys and transmissions within the arm 2710 from exiting the slit into the controlled atmosphere in which the arm 2710 operates.

In this aspect, the transport apparatus 2100 may be configured for operation in a controlled atmosphere such that a controlled sealed environment SE in which the arm 2710 operates is sealed from, for example, an atmospheric environment ATM in an interior of the drive system 2720 (and e.g. an environment in which the drive system is located). The drive system 2720 may also include suitable seals for effecting the seal between the controlled atmosphere from an interior of the drive system 2720. For example, the drive system 2720 may be substantially similar to drive system 1720 described above in that the drive system 2720 includes a chassis 2840, a bottom 2840B, a Z-drive 2823, a ball screw 2821, a ball screw nut 2822, a ball screw support 2820 and a spindle assembly 2800S including a spindle support tube 2830A and a Z-axis carriage 2830B. As may be realized a gap G may exist between the spindle support tube 2830A and flange 2810 (which may be substantially similar to flange 1810) to allow the spindle assembly 2800S to be driven along the Z-axis. To seal this gap G any suitable flexible sealing member 2610 such as a bellows may be provided such that one end of the flexible sealing member 2610 is sealingly fixed to, for example, the flange 2810 while the other end of the flexible sealing member 2610 is sealing fixed to, for example, one or more of the spindle support tube 2830A and Z-axis carriage 2830B. Suitable seals 2600 (which may be substantially similar to seals 500A, 500B described above) may also be placed between the drive shafts 211, 212 and between drive shaft 211 and the motor housing 804H (FIG. 5) in a manner substantially similar to that described above with respect to FIG. 5. As such, an atmospheric barrier is formed between the harmonic drive and the housing 840H and between the outer shaft 211 and inner shaft 212 for sealingly isolating the sealed controlled environment SE on the output side of the drive system from the atmospheric environment ATM within the drive system. The passageway through, for example, the inner drive shaft 212 through which the wires, tubes, cables, etc. pass for connection to the end effector may be sealed using an isolation wire feedthrough 590 (described above with respect to FIG. 4) that may allow the arm to rotate without damaging, for example, the wires, tubes, cables, etc.

Figure 13A:
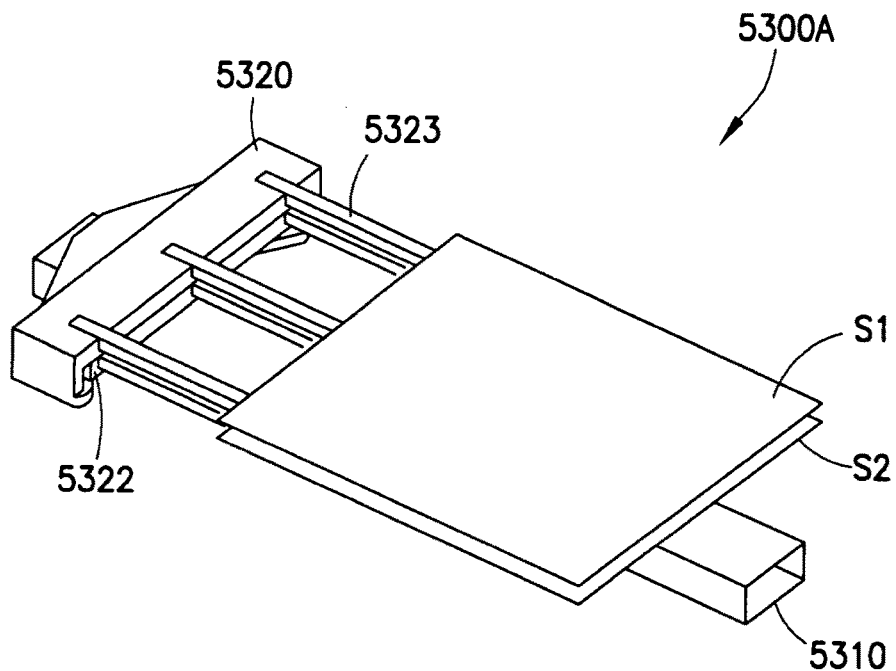
FIGS. 13A-13C are schematic illustrations of a transport apparatus in accordance with an aspect of the disclosed embodiment.
Figure 13B:
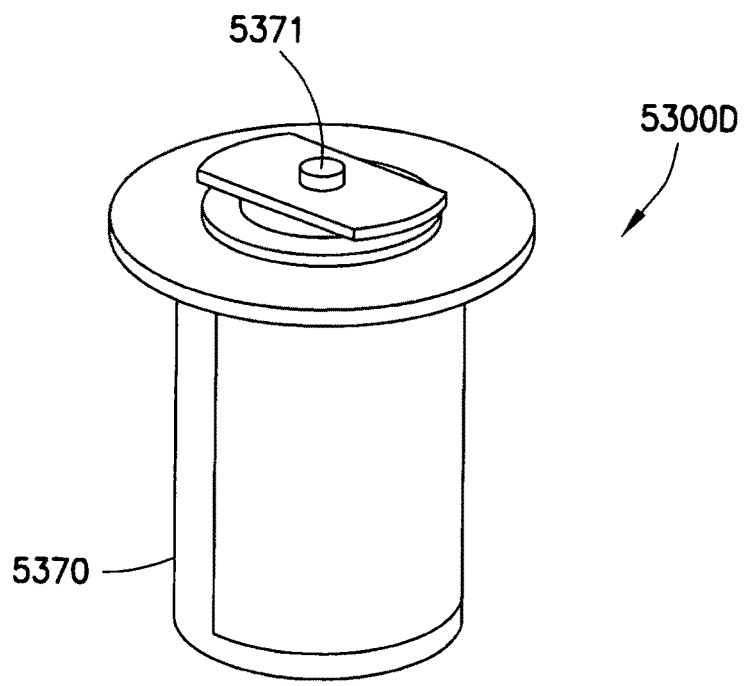
Figure 13C:
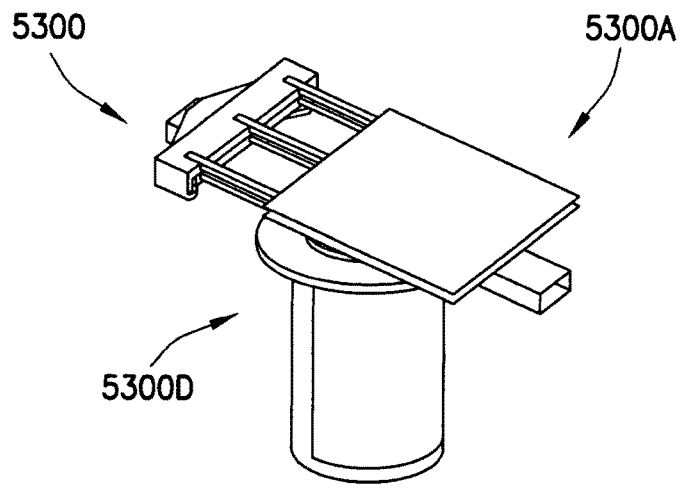
Figure 14A:
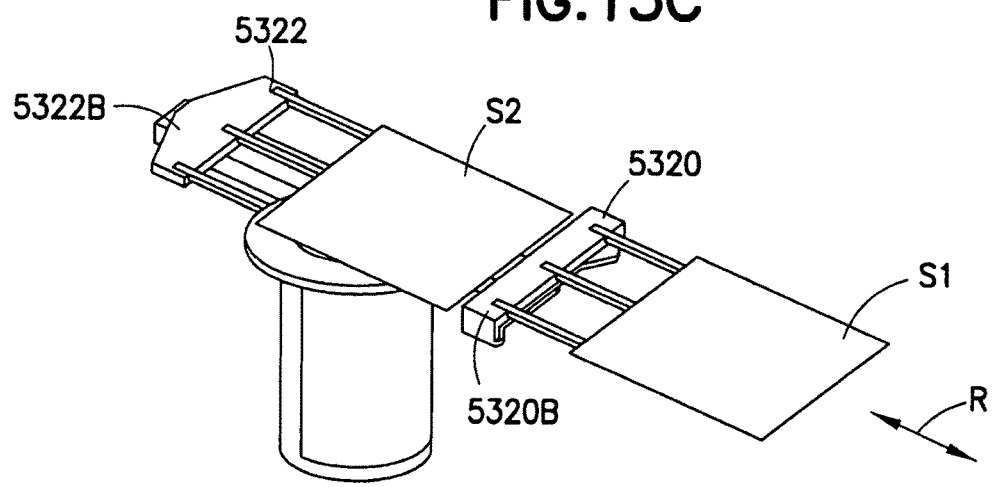
FIGS. 14A and 14B are schematic illustrations of the transport apparatus of FIGS. 13A-13C shown in various positions of extension and retraction.
Figure 14B:
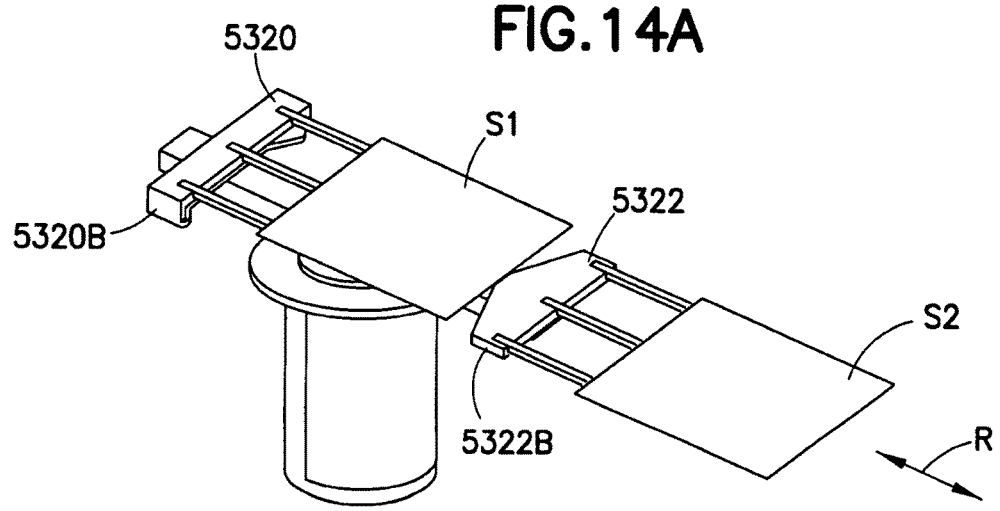

Referring to FIGS. 13A-13C another high capacity transport apparatus 5300 is shown in accordance with an aspect of the disclosed embodiment. In this example, the transport apparatus includes a drive section 5300D and an arm section 5300A. The arm section includes a longitudinally extended base member 5310 and one or more substrate holders 5320, 5322. The one or more substrate holders are configured to travel along at least a portion of the length of the base member in a direction of extension and retraction R (see FIGS. 14A and 14B) in a manner described in greater detail below. The drive section 5300D includes a coaxial drive system including a coaxial drive shaft assembly 5371 where each drive shaft of the coaxial drive shaft assembly 5371 is coupled in any suitable manner to respective ones of the base member 5310 and each of the one or more substrate holders 5320, 5322 as will also be described in greater detail below.

Figure 15:
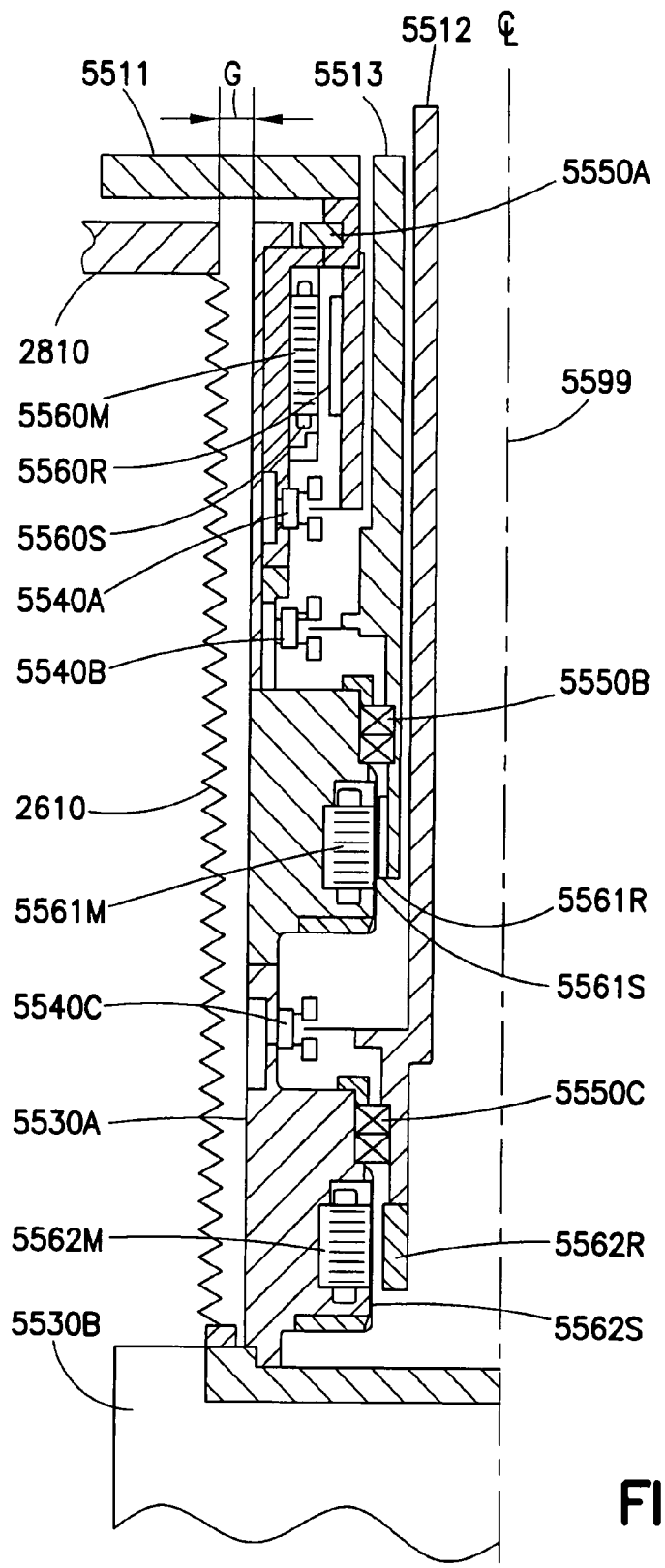
FIG. 15 is a partial schematic illustration of a transport apparatus drive section in accordance with an aspect of the disclosed embodiment.
Figure 16:
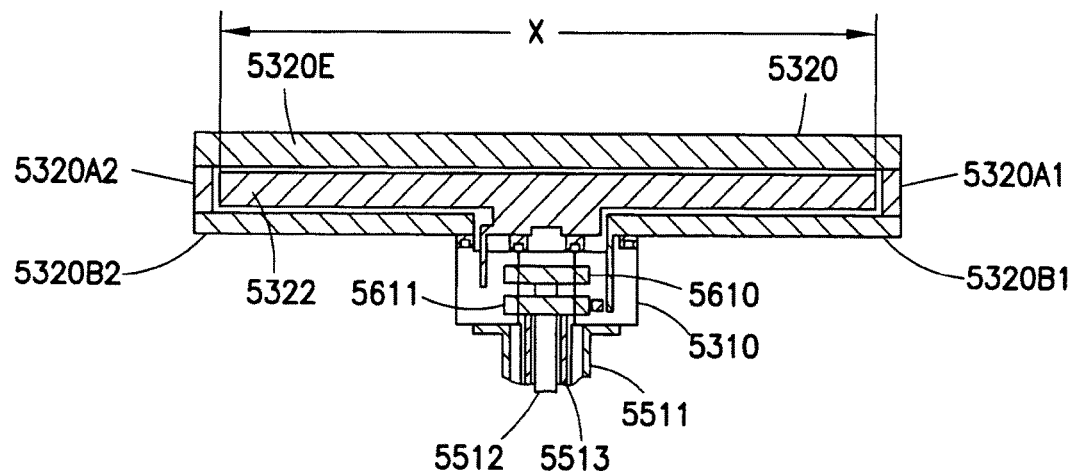
FIG. 16 is a partial schematic illustration of a portion of the transport apparatus of FIGS. 13A-13C in accordance with an aspect of the disclosed embodiment.
Figure 17:
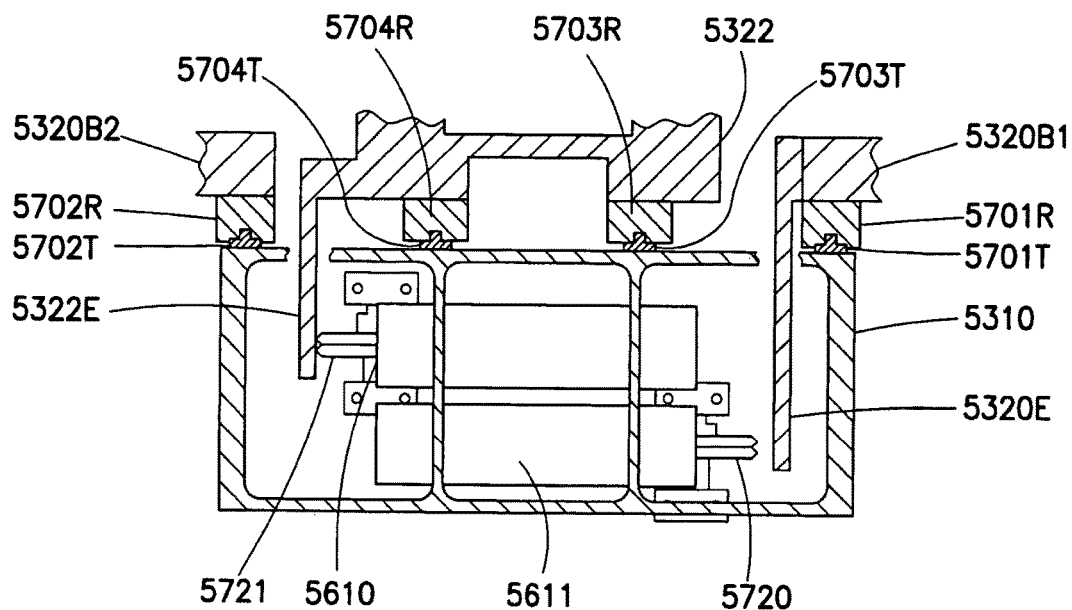
FIG. 17 is a partial schematic illustration of a portion of the transport apparatus of FIGS. 13A-13C in accordance with an aspect of the disclosed embodiment.
Figure 18:
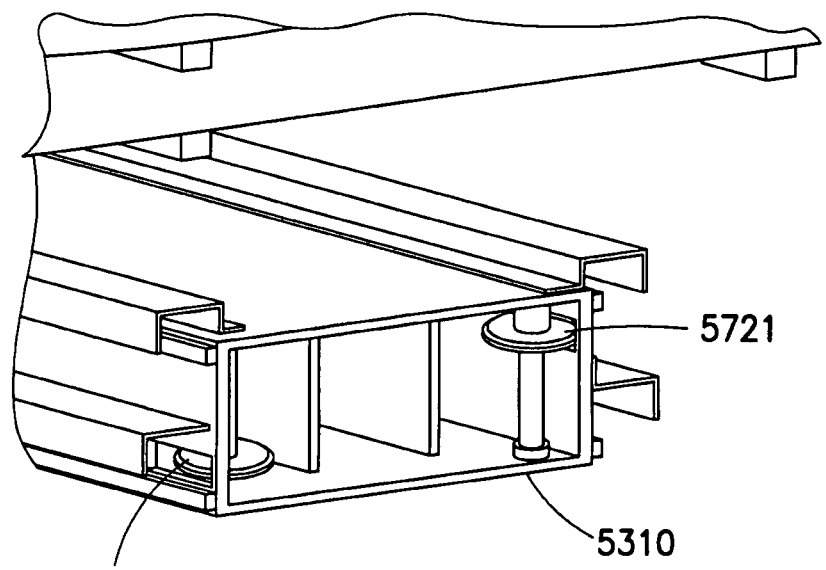
FIG. 18 is a partial schematic illustration of a portion of the transport apparatus of FIGS. 13A-13C in accordance with an aspect of the disclosed embodiment.
Figure 19:
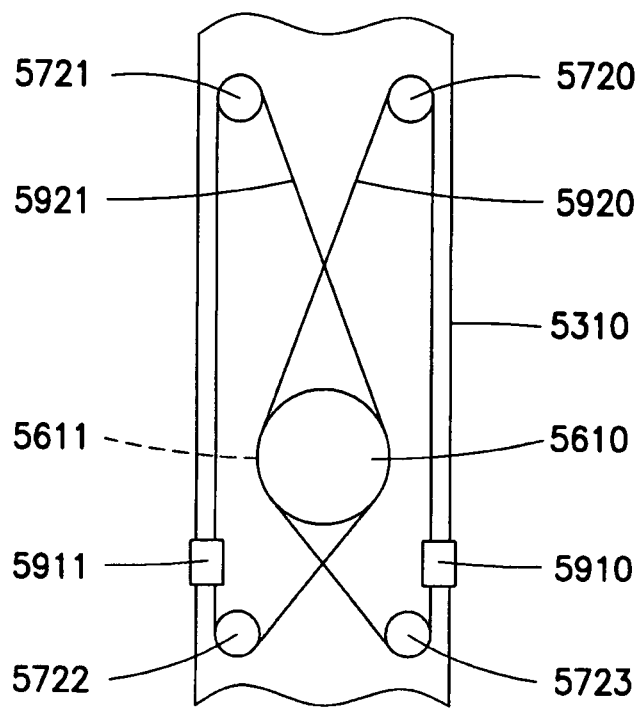
FIG. 19 is a partial schematic illustration of a portion of the transport apparatus of FIGS. 13A-13C in accordance with an aspect of the disclosed embodiment.

Referring to FIGS. 13B and 15 the drive section 5300D includes a chassis 5370 substantially similar to chassis 2840 described above with respect to, for example, FIG. 12C. In this aspect the drive is configured as a direct drive where the output shafts are directly driven by the stators of the drive. At least a portion of a coaxial spindle assembly may be located within the chassis 5370 in a manner substantially similar to that described above with respect to FIG. 12C where the spindle assembly includes a spindle support tube 5530A and a Z-axis carriage 5530B. The Z-axis carriage 5530B may be coupled to any suitable Z-axis drive in any suitable manner as described above with respect to Z-axis drive 2823. The Z-axis drive 2823 is configured to move the spindle assembly relative to the chassis 5370 for e.g. moving the arm assembly 5300A in a direction substantially along and substantially parallel to the axis of rotation 5599 (see FIG. 15) of the coaxial drive shaft assembly 5371. As may be realized a gap G may exist between the spindle support tube 5530A and flange 2810 to allow the spindle assembly to be driven along the Z-axis. In a manner substantially similar to that described above, to seal this gap G any suitable flexible sealing member 2610 such as a bellows may be provided such that one end of the flexible sealing member 2610 is sealingly fixed to, for example, the flange 2810 while the other end of the flexible sealing member 2610 is sealing fixed to, for example, one or more of the spindle support tube 5530A and Z-axis carriage 5530B. The bellows 2610 may cooperate with one or more static isolation barriers (as will be described below) for sealing the drive (e.g. sealing an operating environment of the arm connected to the drive from an external environment).

In one aspect, the spindle support tube 5530A is configured to house one or more motors for rotationally driving respective drive shafts of the coaxial drive shaft assembly 5371. In this aspect of the disclosed embodiment the coaxial drive shaft assembly includes three drive shafts 5511, 5512, 5513 but it should be understood that in other aspects the coaxial drive shaft may have more or less than three drive shafts. A first or upper drive motor may be configured to drive an outer drive shaft 5511 of the drive shaft assembly and includes a stator 5560M and a rotor 5560R. The stator 5560M is stationarily mounted within the spindle support tube 5530A in any suitable manner. The rotor 5560R may be mounted to the drive shaft 5511 in any suitable manner such that as the stator 5560M causes movement/rotation of the rotor 5560R the drive shaft 5511 moves with the rotor 5560R for rotationally driving the drive shaft 5511 about axis of rotation 5599. Any suitable sealing member 5560S such as a static environmental (e.g. vacuum, etc.) isolation barrier may be provided between the stator 5560M and rotor 5560R where the sealing member 5560S is configured to seal the stator 5560M within the spindle support tube 5530A to separate or isolate the stator 5560M from an environment within the spindle support tube 5530A (and the environment in which the arm assembly operates as the interior of the spindle support tube is open to the environment in which the arm assembly operates as will be described below). A second or middle drive motor may be configured to drive a middle drive shaft 5513 of the drive shaft assembly and includes a stator 5561M and a rotor 5561R. The stator 5561M is stationarily mounted within the spindle support tube 5530A in any suitable manner. The rotor 5561R may be mounted to the drive shaft 5513 in any suitable manner such that as the stator 5561M causes the movement of the rotor 5561R the drive shaft 5513 moves with the rotor 5561R for rotationally driving the drive shaft 5513 about axis of rotation 5599. Any suitable sealing member 5561S such as a static environmental (e.g. vacuum, etc.) isolation barrier may be provided between the stator 5561M and rotor 5561R where the sealing member 5561S is configured to seal the stator 5561M within the spindle support tube 5530A to separate or isolate the stator 5561M from an environment within the spindle support tube 5530A (and the environment in which the arm assembly operates as the interior of the spindle support tube is open to the environment in which the arm assembly operates as will be described below). A third or lower drive motor may be configured to drive an inner drive shaft 5512 of the drive shaft assembly and includes a stator 5562M and a rotor 5562R. The stator 5562M is stationarily mounted within the spindle support tube 5530A in any suitable manner. The rotor 5562R may be mounted to the drive shaft 5512 in any suitable manner such that as the stator 5562M causes the movement of the rotor 5562R the drive shaft 5512 moves with the rotor 5562R for rotationally driving the drive shaft 5512 about axis of rotation 5599. Any suitable sealing member 5562S such as a static environmental (e.g. vacuum, etc.) isolation barrier may be provided between the stator 5562M and rotor 5562R where the sealing member 5562S is configured to seal the stator 5562M within the spindle support tube 5530A to separate or isolate the stator 5562M from an environment within the spindle support tube 5530A (and the environment in which the arm assembly operates as the interior of the spindle support tube is open to the environment in which the arm assembly operates as will be described below). As may be realized, where the transport 5300 is to be used in an atmospheric environment the sealing members 5560S, 5561S, 5562S may or may not be provided. It is noted that in one aspect the spindle support tube 5530A may have a unitary one piece construction. In other aspects the spindle support tube 5530A may be constructed of separate stackable housing members or modules (e.g. one housing member or module for each motor) where the housing members can be modularly coupled to each other to form a spindle support tube having any suitable number of motors.

The drive shafts may be supported within the spindle support tube 5530A in any suitable manner such that the rotors 5560R, 5561R, 5562R attached to the respective drive shafts 5511, 5512, 5513 are positioned to interact with the respective stator 5560M, 5561M, 5562M. In one aspect each drive shaft 5511, 5512, 5513 may be supported within the spindle support tube 5530A by any suitable bearings. For example, the outer drive shaft 5511 may be supported (i.e. concentrically and axially) by one or more suitable bearings 5550A disposed towards a top of the spindle support tube 5530A. The middle drive shaft 5513 may be supported (i.e. concentrically and axially) by one or more suitable bearings 5550B disposed towards a middle of the spindle support tube 5530A. The inner shaft 5512 may be supported (i.e. concentrically and axially) by one or more suitable bearings 5550C disposed towards a bottom of the spindle support tube 5530A. It is noted that the bearing locations within the spindle support tube 5530A are exemplary only and in other aspects the bearings may be located in any suitable positions substantially within the spindle support tube 5530A. It is also noted that the bearings may be configured to operate in a vacuum environment. The static environmental isolation barriers 5560S, 5561S, 5562S allow for the absence of, e.g., dynamic environmental (e.g. vacuum, etc.) seals that would otherwise be located between the coaxial spindle assembly 5371 and the spindle support tube 5530A and between each of the drive shafts 5511, 5512, 5513. The absence of dynamic environmental seals in the drive section 5300D allows the use of the transport 5300 in, for example, environments with higher vacuum levels with better leak performance than a transport using dynamic environmental seals. It is noted that while three separate static environmental isolation barriers are described in other aspects a single barrier may be provided for sealing the stators from the environment within the spindle support tube.

The drive section 5300D may also include any suitable sensors for tracking the rotation of the drive shafts 5511, 5512, 5513. In one aspect, any suitable encoder(s) 5540A, 5540B, 5540C may be provided at suitable locations at least partially within the spindle support tube 5530A for sensing the rotation of a respective one of the drive shafts 5511, 5512, 5513.

Referring now to FIGS. 13A-14B and 16-19 the arm assembly 5300A may be driven by the drive section 5300D. For example, the outer drive shaft 5311 may be coupled to the base member 5310 in any suitable manner such that as the drive shaft 5311 rotates the base member rotates with it for changing an angular position (i.e. theta θ axis rotation) of the arm assembly 5300A. It is noted that the arm assembly 5300A and drive section 5300D may be configured to provide unlimited theta θ axis rotation in any suitable manner. A first or upper drive pulley 5610 and a second or lower drive pulley 5611 may be disposed at least partially within the base member 5310 and positioned coaxially with the drive shaft assembly 5371. The middle shaft 5513 may be coupled to the lower drive pulley 5611 in any suitable manner such that as the middle shaft 5513 rotates the lower drive pulley 5611 rotates with it. The lower drive pulley 5611 may include an aperture configured to allow the inner drive shaft 5512 to pass through the lower drive pulley 5611 for coupling to the upper drive pulley 5610 such that the rotation of the lower drive pulley 5611 is not hindered by the inner drive shaft 5512 or the upper drive pulley 5610. As may be realized, while the arm assembly 5300A is described with respect to the coaxial drive section 5300D it should be understood that the arm assembly 5300A may be used in a similar manner with the harmonic drive section and coaxial drive sections described above with respect to FIGS. 4-6, 8A-8C and 12A-12C. Similarly, the arm assemblies described above with respect to FIGS. 3, 7A, 7B and 9A-11C can be used with the coaxial drive section 5300D through appropriate connections between drive shafts and the arm assemblies.

Idler pulleys 5720, 5721 may be located at a first end of the base member 5310 and idler pulleys 5722, 2723 may be located at a second substantially opposite end of the base member 5310 in a manner substantially similar to that described above with respect to FIG. 10. The idler pulleys 5720, 5723 may be disposed within the same plane as the lower drive pulley 5611 such that any suitable transmission 5920 (e.g. belt, band, etc.) can be placed around the pulleys for driving the extension and retraction of, for example, substrate holder 5320 along an axis of extension and retraction R. For example, the idler pulleys 5720, 5723 may be arranged so that a portion of the transmission 5920 extending between the idler pulleys 5720, 5723 is substantially parallel to axis of extension and retraction R. A coupling member 5910 may couple the transmission 5920 to the substrate holder 5320, as will be described below, such that rotation of the drive pulley 5611 causes linear movement of the coupling member 5910 in the direction of extension and retraction R which in turn causes the substrate holder 5320 to move along the axis of extension and retraction R. The idler pulleys 5721, 5722 may be disposed within the same plane as the upper drive pulley 5610 such that any suitable transmission 5921 (e.g. belt, band, etc.) can be placed around the pulleys for driving the extension and retraction of, for example, substrate holder 5322 along the axis of extension and retraction R. For example, the idler pulleys 5721, 5722 may be arranged so that a portion of the transmission 5921 extending between the idler pulleys 5721, 5722 is substantially parallel to axis of extension and retraction R. A coupling member 5911 may couple the transmission 5921 to the substrate holder 5322, as will be described below, such that rotation of the drive pulley 5610 causes linear movement of the coupling member 5911 in the direction of extension and retraction R which in turn causes the substrate holder 5322 to move along the axis of extension and retraction R.

As may be realized, in operation each substrate holder 5320, 5322 can be extended or retracted independently of the other one(s) of the substrate holders 5320, 5322 such that one or more substrate holders 5320, 5322 can be simultaneously extended for picking/placing a substrate through a rotation of a respective drive shaft 5512, 5513 while the drive shaft 5511 for the base member 5310 remains substantially stationary. The arm assembly can be rotated about the axis 5599 as a unit by, for example, rotating the drive shafts 5511, 5512, 5513 in the same direction at substantially the same speed.

As described above, the base member 5310 of the arm assembly 5300A is longitudinally elongated and may form a tube-like structure in which the drive pulleys 5610, 5611, idler pulleys 5720-5723 and transmissions 5920, 5921 are at least partially enclosed. It is noted that the ends of the base member 5310 may include caps (not shown) or other structure to close the ends of the tube to substantially prevent any particles generated from the pulleys and transmissions from escaping the base member 5310 and entering the environment in which the arm assembly 5300A operates. The base member may include one or more suitable tracks or rails 5701T, 5702T, 5703T, 5704T that extend longitudinally along the base member 5310 and have any suitable configuration for supporting and guiding radial movement of the substrate holders 5320, 5322. In one aspect, the tracks may be formed in a unitary one piece construction with the base member 5310 while in other aspects the base tracks may be affixed to the base member 5310 in any suitable manner.

The substrate holders 5320, 5322 may be stacked one above the other in any suitable manner. For example, the lower substrate holder 5322 may include a base member 5322B having any suitable shape and size and one or more substrate supports or fingers 5323 extending from the base member 5322B. In one aspect the one or more substrate supports may have any suitable configuration for holding a substrate S2. The one or more substrate supports 5323 may be coupled to the base member 5322B at a proximate end such that the distal end is cantilevered from the base member 5322B. In one aspect the one or more substrate supports 5323 may be configured to passively grip the substrate S2 while in other another aspect the one or more substrate supports 5323 may be configured to actively grip the substrate S2. The base member 5322B of the lower substrate holder 5322 may include one or more guiding members 5703R, 5704R and an extension member 5322E. In one aspect the guiding members 5703R, 5704R may be formed in a unitary construction with the base member 5322B while in other aspects the guiding members 5703R, 5704R may be affixed to the base member 5322B in any suitable manner. The guiding members 5703R, 5704R are configured to interface with respective tracks 5703T, 5704T such that the guiding members 5703R, 5704R slide along the tracks 5703T, 5704T allowing for the radial displacement of the substrate holder 5322. The guiding members 5703R, 5704R and tracks 5703T, 5704T may be configured such that the substrate holder 5322 is stably held on the base member 5310 such that there is substantially no tipping and/or rotation of the substrate holder 5322 relative to the base member. It is noted that the tracks and guiding members may be constructed of any suitable materials such that particle generation and friction between the tracks and guiding members is minimized. The extension member 5322E may extend from the base member 5322B to couple the substrate holder 5322 to the transmission 5921 through coupling member 5911 in any suitable manner so that rotation of drive pulley 5610 causes the extension and retraction of the substrate holder 5322 along the axis of extension and retraction R.

The substrate holder 5320 includes a base member 5320B having any suitable shape and size and one or more substrate supports or fingers 5323. The substrate supports 5323 (substantially similar to those described above with respect to substrate holder 5322) may be connected to the base member 5320B in a manner substantially similar to that described above with respect to substrate holder 5322. To allow for the stacked arrangement of the substrate holders 5320, 5322, in one aspect the base member 5320B of substrate holder 5320 may be configured to extend or wrap around the substrate holder 5322 so that the substrate holder 5322 passes at least partially through an aperture formed by the base member 5320B. For example, the base member 5320B of the substrate holder 5320 includes an upper member 5320E from which the substrate supports 5323 extend. A first spacer member 5320A1 is affixed to a first side of the upper portion 5320E. A second spacer member 5320A2 is affixed to a second opposite side of the upper member 5320E. The first and second spacer members 5320A1, 5320A2 may be spaced any suitable distance X from each other so that they straddle the base member 5322B of the lower substrate holder 5322. A first lower member 5320B1 is affixed at a first end to the first spacer member 5320A1 and extends towards the base member 5310. A guiding member 5701R (substantially similar to guiding members 5703R, 5704R) is disposed at a second opposite end of the first lower member 5320B1 for interfacing with a respective track 5701T of the base member 5310 in a manner substantially similar to that described above with respect to the lower substrate holder 5322. An extension member 5320E substantially similar to extension member 5322E may be affixed to the second end of the first lower member for coupling the substrate holder 5320 to the transmission 5920 through coupling member 5910 in any suitable manner so that rotation of drive pulley 5611 causes the extension and retraction of the substrate holder 5320 along the axis of extension and retraction R. A second lower member 5320B2 is affixed at a first end to the second spacer member 5320A2 and extends towards the base member 5310. A guiding member 5702R (substantially similar to guiding members 5703R, 5704R) is disposed at a second opposite end of the second lower member 5320B2 for interfacing with a respective track 5702T of the base member 5310 in a manner substantially similar to that described above with respect to the lower substrate holder 5322. As may be realized, the upper member 5320E, spacer members 5320A1, 5320A2 and the lower member 5320B1, 5320B2 form the aperture through which the substrate holder 5322 at least partially passes through in a substantially unobstructed manner. It should be understood that while the substrate holders of the arm assembly 5300A are described as extending in the same direction in other aspects the substrate holders may extend in substantially opposite directions.

Figure 20:
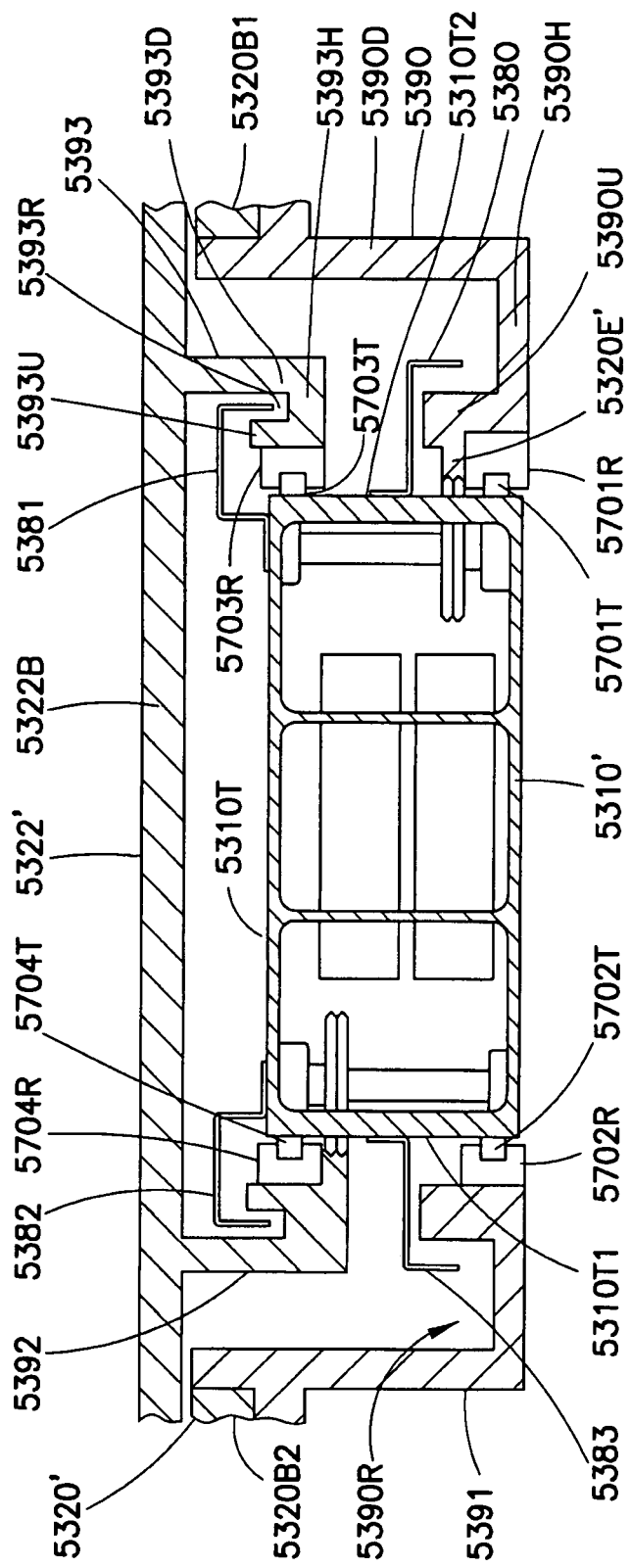
FIG. 20 is a partial schematic illustration of a portion of the transport apparatus of FIGS. 13A-13C in accordance with an aspect of the disclosed embodiment.

Referring now to FIG. 20, in one aspect the base member 5310 may also include seal members 5380-5383 that cooperate with the substrate holders 5320', 5322' to form labyrinth seals for substantially preventing particles generated by the tracks and guiding members from entering the environment in which the arm assembly operates. The substrate holders 5320', 5322' and base member 5310' may be substantially similar to substrate holders 5320, 5322 and base member 5310 described above, except where otherwise noted. In this aspect the tracks 5701T-5704T are disposed on the sides of the base member 5310' rather than on a top of the base member as described above with respect to FIGS. 16 and 17. The substrate support 5322' includes connecting members 5392, 5393 that extend from the substrate support 5322' and straddle the sides of the base member 5310'. Each connecting member 5392, 5393 includes a first portion 5393D that extends in a direction away from the base 5322B of the base member 5322'. A second portion 5393H extends from an end of the first portion 5393D that is opposite the base 5322B. The second portion 5393H extends away from the first portion 5393D, substantially parallel to the base 5322B and towards the base member 5310'. A third portion 5393U extends from the second portion 5393H towards the base 5322B so that the third portion 5393U, second portion 5393H and first portion 5393D form a pocket or recessed area 5393R. Guiding members 5703R, 5704R are affixed to respective ones of the third portions 5393U for slidably coupling the substrate support 5322' to the base member 5310' through the interface between the guiding members 5703R, 5704R and the respective tracks 2703T, 5704T. As may be realized, at least one of the connecting members 5392, 5393 includes an extension member 5322E' that is coupled to the coupling member 5911 for coupling the transmission 5921 to the substrate holder 5322' in a manner substantially similar to that described above. Seal members 5381, 5382 may be mounted to, for example, a surface 5310T of the base member 5310' and have a substantially "U" shaped configuration that extends from the base member 5310', around respective ones of the tracks 5703T, 5704T, guiding members 5703R, 5704R and third portions 5393U and into a respective recess 5393R to substantially form a labyrinth type seal with a respective connecting member 5392, 5393. It should be understood that the configuration of the connecting members 5392, 5393 and sealing members 5381, 5382 are exemplary and in other aspects the connecting members and sealing members may have any suitable configurations and shapes.

The substrate support 5320' includes connecting members 5390, 5391 that extend from the substrate support 5320' and straddle the sides of the base member 5310' in a manner substantially similar to that described above with respect to substrate support 5322'. Each connecting member 5390, 5391 includes a first portion 5390D that extends in a direction away from a respective one of the lower members 5320B1, 5320B2 of the base member 5320'. A second portion 5390H extends from an end of the first portion 5390D that is opposite the respective lower member 5320B1, 5320B2. The second portion 5390H extends away from the first portion 5390D, substantially parallel to the respective lower member 5320B1, 5320B2 and towards the base member 5310'. A third portion 5390U extends from the second portion 5390H towards the respective lower member 5320B1, 5320B2 so that the third portion 5390U, second portion 5390H and first portion 5390D form a pocket or recessed area 5390R. Guiding members 5701R, 5702R are affixed to respective ones of the third portions 5390U for slidably coupling the substrate support 5320' to the base member 5310' through the interface between the guiding members 5701R, 5702R and the respective tracks 2701T, 5702T. As may be realized, at least one of the connecting members 5390, 5391 includes an extension member 5320E' that is coupled to the coupling member 5910 for coupling the transmission 5920 to the substrate holder 5320' in a manner substantially similar to that described above. Seal members 5380, 5383 may be mounted to, for example, respective surfaces 5310T1, 5310T2 of the base member 5310' and have a substantially "L" shaped configuration that extends from the base member 5310', around respective ones of the tracks 5701T, 5702T, guiding members 5701R, 5702R and third portions 5390U and into a respective recess 5390R to substantially form a labyrinth type seal with a respective connecting member 5390, 5391. It should be understood that the configuration of the connecting members 5390, 5391 and sealing members 5380, 5383 are exemplary and in other aspects the connecting members and sealing members may have any suitable configurations and shapes.

Figure 21:
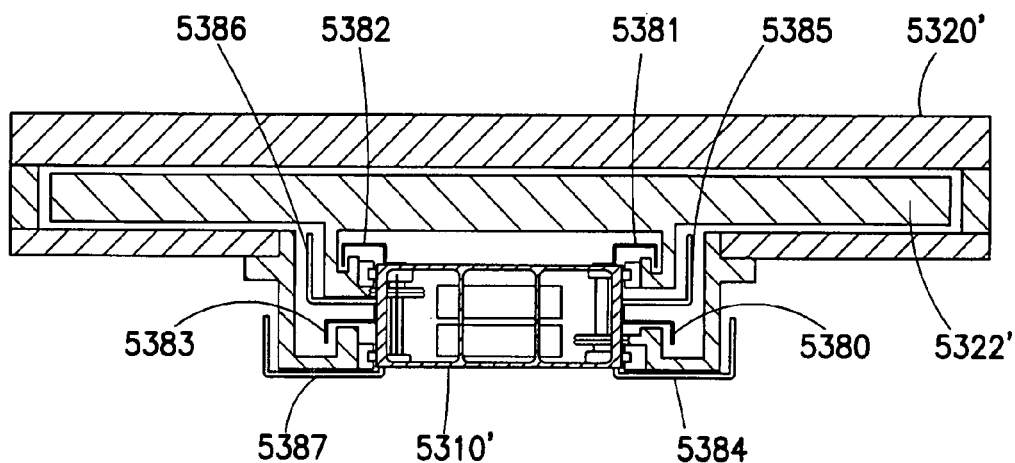
FIG. 21 is a partial schematic illustration of a portion of the transport apparatus of FIGS. 13A-13C in accordance with an aspect of the disclosed embodiment.

Referring to FIG. 21 additional seal members 5383-5386 may be affixed to the base member 5310' to form the labyrinth seals. For example, seal members 5385, 5386 may extend from the base member 5310' and have a substantially "L" shaped configuration that extends underneath and around respective ones of the tracks 5703T, 5704T, guiding members 5703R, 5704R and at least a portion of the connecting members 5392, 5393 so that a free end of the sealing members 5385, 5386 extends along and in a direction substantially parallel to the respective first portions 5393D. Similarly, seal members 5384, 5387 may extend from the base member 5310' and have a substantially "L" shaped configuration that extends underneath and around respective ones of the tracks 5701T, 5702T, guiding members 5701R, 5702R and at least a portion of the connecting members 5390, 5391 so that a free end of the sealing members 5384, 5387 extends along and in a direction substantially parallel to the respective first portions 5390D. As may be realized the shape and configuration of the seal members 5384-5387 is exemplary and that the seal members may have any suitable shape and configuration for forming a labyrinth seal with the respective connecting members 5390-5393.

It should be understood that while seal members 5380-5383 have been described with respect to substrate holders 5320', 5322' that substrate holders 5320, 5322 may include other extensions or other protrusions having shapes substantially similar to those described above with respect to FIG. 20 that cooperate with seal members mounted to the base member 5310 for forming any suitable seals substantially around the tracks 5701T-5704T and guiding members 5701R-5704R.

In accordance with a first aspect of the disclosed embodiment a robotic transport apparatus is provided. The robotic transport apparatus includes a drive system including at least one harmonic motor assembly, at least one drive shaft coupled to the at least one harmonic motor assembly, at least one robotic arm mounted to the at least one drive shaft, where the robotic arm is located inside a sealed environment, and at least one atmospheric isolation seal seated on an output surface of the drive system and forming an atmospheric barrier disposed so that the at least one drive shaft extends through the atmospheric barrier into the sealed environment and the at least one harmonic motor assembly is located outside the sealed environment, wherein the robotic transport apparatus is a high capacity payload transport apparatus.

In accordance with the first aspect of the disclosed embodiment a portion of the at least one harmonic motor assembly is configured as a seating surface for the at least one atmospheric isolation seal.

In accordance with the first aspect of the disclosed embodiment the atmospheric isolation seal is a ferrofluidic seal.

In accordance with the first aspect of the disclosed embodiment an output portion of the at least one harmonic motor assembly is sealingly isolated from an input portion of the harmonic motor assembly.

In accordance with the first aspect of the disclosed embodiment the at least one harmonic motor assembly includes a first harmonic motor assembly and a second harmonic motor assembly being linearly arranged and having a common axis of rotation and the at least one drive shaft includes a first and second coaxial drive shaft assembly. In a further aspect, the first and second harmonic motor assemblies are configured to substantially maintain a concentricity of the first and second drive shafts for providing a gap in which the at least one ferrofluidic seal is disposed. In another aspect the robotic transport apparatus further includes a third drive shaft concentrically located with the first and second drive shafts and a third harmonic motor assembly is coupled to the third drive shaft.

In accordance with the first aspect of the disclosed embodiment the at least one drive shaft includes a feedthrough configured for the passage of wires through the coaxial drive shaft assembly.

In accordance with the first aspect of the disclosed embodiment the robotic arm comprises a sliding end effector arrangement.

In accordance with the first aspect of the disclosed embodiment the drive system includes a Z-axis drive motor.

In accordance with the first aspect of the disclosed embodiment the robotic transport apparatus is configured to carry a payload of about one kilogram to about twenty kilograms, a payload of about fifteen kilograms to about twenty kilograms, a payload of about fifteen kilograms, or a payload of about twenty kilograms.

In accordance with a second aspect of the disclosed embodiment a robotic transport apparatus is provided. The robotic transport apparatus includes a drive system including at least one motor assembly including a coaxial drive spindle with at least two drive shafts and corresponding motor rotors and motor stators, and at least one linearly sliding transport arm mounted to the coaxial spindle, where the coaxial motor assembly is coupled to the at least one sliding robotic arm through the coaxial spindle and configured to substantially directly drive the at least two drive shafts for effecting movement of the at least one linearly sliding transport arm, wherein the coaxial drive spindle is in a sealed environment and at least one of the motor stators and motor rotors is isolated outside the sealed environment and all seals sealing the coaxial drive spindle within the sealed environment are static seals.

In accordance with the second aspect the at least one linearly sliding transport arm comprises a linearly sliding end effector arrangement.

In accordance with the second aspect the at least one linearly sliding transport arm includes at least two end effectors stacked one above the other and a base member where each end effector is slidably mounted to the base member independently of other ones of the at least two end effectors.

In accordance with the second aspect the robotic transport further includes a Z-axis drive motor.

In accordance with the second aspect the drive system includes a housing holding the sealed environment, a stator and a rotor for each drive shaft and at least one static isolation barrier, where the stator, rotor and isolation barrier are disposed within the housing and the at least one static isolation barrier is configured to seal the stators from the sealed environment within the housing such that the stators are located outside the sealed environment and an interior of the housing remains open to the sealed environment.

In accordance with a third aspect of the disclosed embodiment a substrate processing apparatus is provided. The substrate processing apparatus includes a frame having a casing defining a sealed atmosphere that is sealed from an external atmosphere, a substrate transport apparatus connected to the frame, the substrate transport apparatus including a triaxial drive system including at least three drive shafts sealed within the sealed atmosphere, and a transport arm coupled to the drive system, the transport arm including a base member and at least one substrate holder configured to support high capacity loads, the at least one substrate holder being slidably mounted to the base member so that the at least one substrate holder is linearly slidable relative to the base member where the coupling between the transport arm and the drive system is a substantially direct drive coupling to each of the at least three drive shafts effecting a rotation and extension of the transport arm.

In accordance with the third aspect the drive system includes coaxial drive shafts where one of the coaxial drive shafts is substantially directly coupled to the base member for rotating the base member about a drive axis of rotation and other ones of the coaxial drive shafts are substantially directly coupled to respective ones of the at least one substrate holder for effecting sliding movement of the respective one of the at least one substrate holder independent of other ones of the at least one substrate holder.

In accordance with the third aspect the at least one substrate holder includes supports that are slidingly coupled to the base member, the supports being configured to form at least part of a labyrinth seal. In a further aspect the substrate processing apparatus further includes shield members coupled to the base member, the shield members being configured to interface with the supports to form at least part of the labyrinth seal.

In accordance with the third aspect the at least one substrate holder comprises at least two substrate holders disposed in a stacked configuration.

It should be understood that the exemplary embodiments described herein may be used individually or in any suitable combination thereof. It should also be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

What is claimed is:

1. A robotic transport apparatus comprising:
   a drive system including at least one harmonic motor assembly;
   at least one drive shaft coupled to the at least one harmonic motor assembly;
   at least one robotic arm mounted to the at least one drive shaft, where the robotic arm is located inside a sealed environment; and
   at least one atmospheric isolation seal seated on an output surface, that is distinct from and engaged to the at least one drive shaft, of the drive system and forming an atmospheric barrier disposed so that the at least one drive shaft extends through the atmospheric barrier into the sealed environment and the at least one harmonic motor assembly is located outside the sealed environment;
   wherein the robotic transport apparatus is a heavy payload capacity transport apparatus and wherein a portion of the at least one harmonic motor assembly is configured as a seating surface for the at least one atmospheric isolation seal.

2. The robotic transport apparatus of claim 1 wherein the atmospheric isolation seal is a ferrofluidic seal.

3. The robotic transport apparatus of claim 1 wherein an output portion of the at least one harmonic motor assembly is sealingly isolated from an input portion of the harmonic motor assembly.

4. The robotic transport apparatus of claim 1 wherein the at least one harmonic motor assembly includes a first harmonic motor assembly and a second harmonic motor assembly being linearly arranged and having a common axis of rotation and the at least one drive shaft includes a first and second coaxial drive shaft assembly.

5. The robotic transport apparatus of claim 4 wherein the first and second harmonic motor assemblies are configured to substantially maintain a concentricity of the first and second drive shafts for providing a gap in which the at least one atmospheric isolation seal is disposed.

6. The robotic transport apparatus of claim 4 further comprising a third drive shaft concentrically located with the first and second drive shafts and a third harmonic motor assembly is coupled to the third drive shaft.

7. The robotic transport apparatus of claim 1 wherein the at least one drive shaft includes a feedthrough configured for the passage of wires through the at least one drive shaft, where the at least one drive shaft forms a coaxial drive shaft assembly.

8. The robotic transport apparatus of claim 1 wherein the robotic arm comprises a sliding end effector arrangement.

9. The robotic transport apparatus of claim 1 wherein the drive system includes a Z-axis drive motor.

10. The robotic transport apparatus of claim 1 wherein the robotic transport apparatus is configured to carry a payload of about one kilogram to about twenty kilograms, a payload of about fifteen kilograms to about twenty kilograms, a payload of about fifteen kilograms, or a payload of about twenty kilograms.

11. A robotic transport apparatus comprising:
a drive system including at least one harmonic motor assembly including a coaxial drive spindle with at least two drive shafts and corresponding motor rotors and motor stators; and
at least one linearly sliding transport arm mounted to the coaxial spindle, where the coaxial motor assembly is coupled to the at least one linearly sliding transport arm through the coaxial spindle and configured to substantially directly drive the at least two drive shafts for effecting movement of the at least one linearly sliding transport arm;
wherein the coaxial drive spindle is in a sealed environment and the motor stators and motor rotors of the harmonic motor assembly are isolated outside the sealed environment and all seals sealing the coaxial drive spindle within the sealed environment are static seals.

12. The robotic transport apparatus of claim 11 wherein the at least one linearly sliding transport arm comprises a linearly sliding end effector arrangement.

13. The robotic transport apparatus of claim 11 wherein the at least one linearly sliding transport arm includes at least two end effectors stacked one above the other and a base member where each end effector is slidably mounted to the base member independently of other ones of the at least two end effectors.

14. The robotic transport apparatus of claim 11 wherein the robotic transport further includes a Z-axis drive motor.

15. The robotic transport apparatus of claim 11 wherein the drive system includes a housing holding the sealed environment, a stator and a rotor for each drive shaft and at least one static isolation barrier, where the stator, rotor and isolation barrier are disposed within the housing and the at least one static isolation barrier is configured to seal the stators from the sealed environment within the housing such that the stators are located outside the sealed environment and an interior of the housing remains open to the sealed environment.

16. A substrate processing apparatus comprising:
a frame having a casing defining a sealed atmosphere that is sealed from an external atmosphere; and
a substrate transport apparatus connected to the frame, the substrate transport apparatus including a triaxial drive system including a harmonic motor assembly coupled to at least three drive shafts sealed within the sealed atmosphere and the harmonic motor assembly is located outside the sealed atmosphere; and
a transport arm coupled to the drive system, the transport arm including a base member and at least one substrate holder configured to support heavy payloads, the at least one substrate holder being slidably mounted to the base member so that the at least one substrate holder is linearly slidable relative to the base member where the coupling between each of the base member and the at least one substrate holder of the transport arm and the drive system is a substantially direct drive coupling to each of the at least three drive shafts effecting a rotation and extension of the transport arm.

17. The substrate processing apparatus of claim 16 wherein the drive system includes coaxial drive shafts where one of the coaxial drive shafts is substantially directly coupled to the base member for rotating the base member about a drive axis of rotation and other ones of the coaxial drive shafts are substantially directly coupled to respective ones of the at least one substrate holder for effecting sliding movement of the respective one of the at least one substrate holder independent of other ones of the at least one substrate holder.

18. The substrate processing apparatus of claim 16 wherein the at least one substrate holder includes supports that are slidingly coupled to the base member, the supports being configured to form at least part of a labyrinth seal.

19. The substrate processing apparatus of claim 18 further comprising shield members coupled to the base member, the shield members being configured to interface with the supports to form at least part of the labyrinth seal.

20. The substrate processing apparatus of claim 16 wherein the at least one substrate holder comprises at least two substrate holders disposed in a stacked configuration.

* * * * *